United States Patent
Banno et al.

(10) Patent No.: US 10,923,534 B2
(45) Date of Patent: Feb. 16, 2021

(54) RECTIFYING ELEMENT AND SWITCHING ELEMENT HAVING THE RECTIFYING ELEMENT

(71) Applicant: NEC Corporation, Tokyo (JP)

(72) Inventors: Naoki Banno, Tokyo (JP); Munehiro Tada, Tokyo (JP); Noriyuki Iguchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/322,539

(22) PCT Filed: Jul. 24, 2017

(86) PCT No.: PCT/JP2017/026709
§ 371 (c)(1),
(2) Date: Feb. 1, 2019

(87) PCT Pub. No.: WO2018/025691
PCT Pub. Date: Feb. 8, 2018

(65) Prior Publication Data
US 2019/0181182 A1    Jun. 13, 2019

(30) Foreign Application Priority Data
Aug. 4, 2016   (JP) .................................. 2016-153930

(51) Int. Cl.
*H01L 27/24*    (2006.01)
*H01L 29/88*    (2006.01)
(Continued)

(52) U.S. Cl.
CPC ...... *H01L 27/2409* (2013.01); *H01L 21/0262* (2013.01); *H01L 21/02532* (2013.01);
(Continued)

(58) Field of Classification Search
CPC combination set(s) only.
See application file for complete search history.

(56) References Cited

U.S. PATENT DOCUMENTS

| 4,452,875 A | * | 6/1984 | Ogawa | ..................... G03G 5/14 |
| | | | | 252/501.1 |
| 2011/0233505 A1 | * | 9/2011 | Nitta | ....................... H01L 27/24 |
| | | | | 257/3 |

(Continued)

FOREIGN PATENT DOCUMENTS

| JP | 4-229635 A | 8/1992 |
| JP | 2002-536840 A | 10/2002 |

(Continued)

OTHER PUBLICATIONS

Tada, et al., "Improved On-State Reliability of Atom Switch Using Alloy Electrodes", IEEE Transactions on Electron Devices, vol. 60, No. 10, Oct. 2013 (pp. 3534-3540).

Banno, et al., "A Novel Two-Varistors (a-Si/SiN/a-Si) selected Complementary Atom Switch with Multiple Fan-outs", IEEE Technical Digest International Electron Devices Meeting, 2015 (pp. 2.5.1-2.5.4).

(Continued)

*Primary Examiner* — Moin M Rahman

(57) ABSTRACT

Provided is a rectifying element that prevents erroneous writing and an erroneous operation and that is substituted for a select transistor; a rewritable semiconductor device that uses a nonvolatile switch including the rectifying element and having excellent reliability, a small area, and low power consumption has a stacked structure of a first electrode 11, a first buffer layer 14, a rectifying layer 13, a second buffer layer 15, and a second electrode 12; and the rectifying layer 13 comprises a first silicon nitride layer 16 having a high nitrogen content (50 atm % or more) and second silicon nitride layers 17A and 17B having a lower nitrogen content than the first silicon nitride layer 16 (50 atm % or less), wherein the second silicon nitride layers 17A and 17B are in contact with the first and second buffer layers (14, 15), respectively, and the first silicon nitride layer 16 is sand- (Continued)

wiched between the second silicon nitride layers 17A and 17B.

16 Claims, 12 Drawing Sheets

(51) Int. Cl.
    *H01L 21/8239* (2006.01)
    *H01L 45/00* (2006.01)
    *H01L 21/02* (2006.01)
(52) U.S. Cl.
    CPC .... *H01L 21/02592* (2013.01); *H01L 21/8239* (2013.01); *H01L 27/2418* (2013.01); *H01L 27/2436* (2013.01); *H01L 27/2472* (2013.01); *H01L 29/88* (2013.01); *H01L 45/00* (2013.01); *H01L 45/085* (2013.01); *H01L 45/1233* (2013.01); *H01L 45/14* (2013.01)

(56) References Cited

U.S. PATENT DOCUMENTS

2011/0272664 A1* 11/2011 Tada .................. H01L 45/04
                                                      257/4
2017/0194424 A1*  7/2017 Huang ............. H01L 21/02532

FOREIGN PATENT DOCUMENTS

| JP | 5382001 B2 | 1/2014 |
| JP | 2015-76609 A | 4/2015 |
| JP | 5692085 B2 | 4/2015 |
| JP | 5790660 B2 | 10/2015 |
| JP | 5794231 B2 | 10/2015 |
| WO | 2013/190988 A1 | 12/2013 |

OTHER PUBLICATIONS

International Search Report of PCT/JP2017/026709 dated Oct. 24, 2017.

* cited by examiner

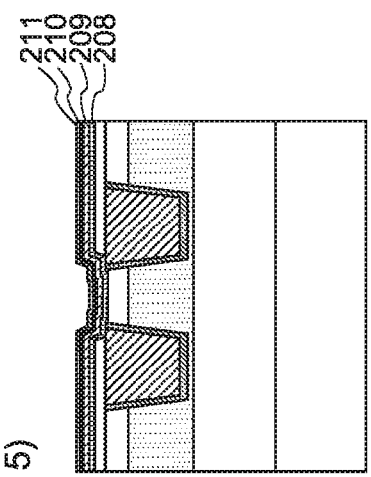
(Step 5)
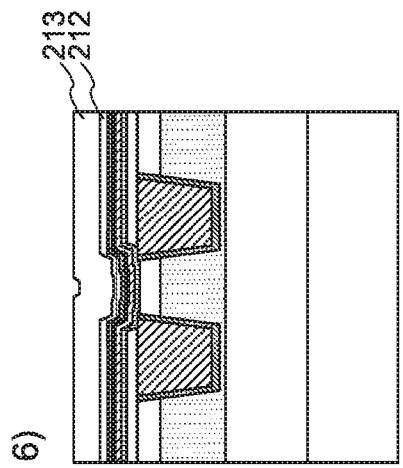
(Step 6)
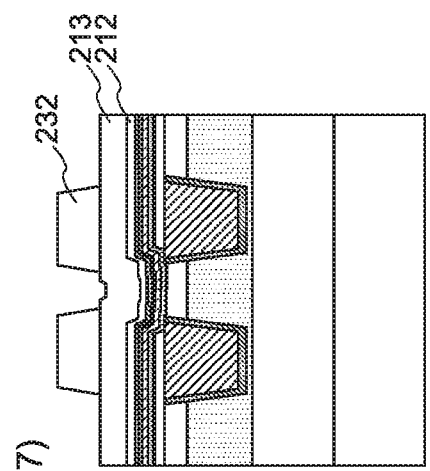
(Step 7)
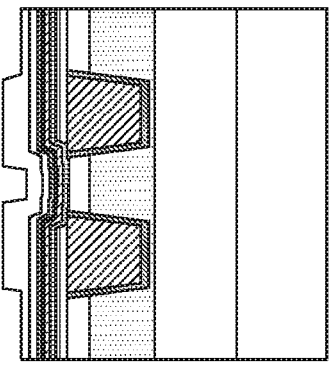
(Step 8)
Fig. 10-2

RECTIFYING ELEMENT AND SWITCHING ELEMENT HAVING THE RECTIFYING ELEMENT

This application is a National Stage Entry of PCT/JP2017/026709 filed on Jul. 24, 2017, which claims priority from Japanese Patent Application 2016-153930 filed on Aug. 4, 2016, the contents of all of which are incorporated herein by reference, in their entirety.

TECHNICAL FIELD

The present invention relates to a rectifying element and a switching element including the rectifying element and a variable resistance element.

BACKGROUND ART

In order to diversify functions of programmable logic and promote implementation in electronic apparatuses and the like, it is necessary to reduce the size of a switch that connects logic cells to each other and reduce the ON resistance thereof. A switching element utilizing metal deposition in an ion conductive layer where metal ions are conducted is known to have a smaller size and a lower ON resistance than conventional semiconductor switches. Such switching elements include a 2-terminal switch disclosed in Patent Literature 1 and a 3-terminal switch disclosed in Patent Literature 2. The 2-terminal switch has a structure in which an ion conductive layer is sandwiched between a first electrode that supplies metal ions and a second electrode that does not supply ions. Switching is attained between the two electrodes by formation/extinction of a metal bridge in the ion conductive layer. Since the 2-terminal switch has a simple structure, the production process is simple, and the element size can be reduced to the order of nanometer. The 3-terminal switch has a structure in which the second electrodes of two 2-terminal switches are integrated, and high reliability is ensured.

The ion conductive layer is desirably a porous polymer mainly containing silicon, oxygen, and carbon. A porous-polymer ion conductive layer is capable of retaining a high dielectric breakdown voltage even when a metal bridge is formed and, therefore, has excellent operational reliability (Patent Literature 3).

In order to mount a switching element as a wiring selector switch of a programmable logic, it is necessary to increase the density by reducing the size of the switching element and simplify the production process. The wiring material of the latest semiconductor device is mainly composed of copper, and a method for efficiently forming a switching element in a copper wiring is desired. Concerning a technique for integrating a switching element that utilizes metal ion migration and an electrochemical reaction into a semiconductor device, Patent Literature 4 discloses a 2-terminal switch, and Patent Literature 5 discloses a 3-terminal switch. Therein, a technique that allows a copper wiring on a semiconductor substrate to also serve as a first electrode of a switching element is described. The use of such a structure makes it possible to eliminate the step of newly forming a first electrode. Accordingly, a mask for forming the first electrode is unnecessary, and the number of photomasks (PR) that should be added to produce a variable resistance element can be two. In this case, forming an ion conductive layer (second ion conductive layer) directly on a copper wiring results in the oxidized surface of the copper wiring and an increased leakage current, and therefore a metallic thin film that functions as an oxidation sacrificial layer is interposed between the copper wiring and the ion conductive layer. The metallic thin film is oxidized by oxygen contained in the ion conductive layer and becomes a part of the ion conductive layer (first ion conductive layer). The metal constituting the oxidation sacrificial layer forms an alloy layer at the interface with copper and is incorporated into a metal bridge when the metal bridge is formed by voltage application. Non-Patent Literature 1 discloses that due to the metal diffused in the metal bridge, the heat stability of the bridge is enhanced, and retention is improved. In this case, since the metal is incorporated in the metal bridge, efficiency of Joule heat production is enhanced, and therefore the current required during transition from ON to OFF is not increased.

To a wiring selector switch of a programmable logic, a crossbar switch structure is applied in which a switching element is disposed at an intersection of wirings. In the crossbar switch structure, at least one select transistor is required for each switch in order to suppress a sneak current during signal transmission and to limit a current during selection (programing), and thus the crossbar switch structure is problematic in that the transistor area is large, and the advantage of reducing the switch size cannot be utilized. Accordingly, Non-Patent Literature 2 discloses a structure in which a bipolar rectifying element is disposed on a 3-terminal switch. The programing of the 3-terminal switch is performed through the rectifying element, and the current during writing is limited by the current arriving in the rectifying element. Moreover, a sneak current to adjacent elements via the control terminal of the 3-terminal element is suppressed by the rectifying element, and erroneous writing is prevented. However, in rows/columns of a crossbar switch structure, when writing in one or more respective locations results in erroneous writing of other adjacent elements, and there is a problem in that multiple fan-outs (FO) are not possible. In order to solve this problem, Non-Patent Literature 2 further proposes a structure in which two bipolar rectifying elements are disposed on a 3-terminal switch. This structure enables sneak current suppression and current limiting by two rectifying elements having a smaller area than the 3-terminal switch, and also enables multiple fan-outs by disposing one rectifying element for each of the two 2-terminal switches constituting the 3-terminal switch. The rectifying element in Non-Patent Literature 2 is composed of a metal nitride electrode, amorphous silicon, and silicon nitride.

CITATION LIST

Patent Literature

Patent Literature 1: JP2002-536840A
Patent Literature 2: JP5790660B
Patent Literature 3: JP5692085B
Patent Literature 4: JP5382001B
Patent Literature 5: JP5794231B

Non-Patent Literature

Non-Patent Literature 1: IEEE TRANSACTION ON ELECTRON DEVICES, vol. 60, page 3534 to page 3540, 2013
Non-Patent Literature 2: IEEE TECHNICAL DIGEST INTERNATIONAL ELECTRON DEVICES MEETING 2015, page 2.5.1 to page 2.5.4, 2015

SUMMARY OF INVENTION

Technical Problem

A nonvolatile switch structure including a rectifying element needs to have nonlinear rectifying characteristics that allow a sufficient current for transitioning the switching characteristics to ON to flow to the rectifying element when a switching voltage is applied, and that realize a sufficient high-resistance state capable of suppressing a current path or a so-called sneak current via a switching element that has been transitioned to ON when an operating voltage at the time of signal transmission is applied. The rectifying characteristics of conventional rectifying elements still have room for improvement in rectifying characteristics to enable substitution for a select transistor of a wiring selector switch of a programmable logic.

The present invention was conceived in order to solve the problem of related art as described above, and an object is to provide a rectifying element that prevents erroneous writing and an erroneous operation and that is substituted for a select transistor, and a rewritable semiconductor device that uses a nonvolatile switch including the rectifying element and having excellent reliability, a small area, and low power consumption.

Solution to Problem

According to one aspect of the present invention, provided is:

a rectifying element having a structure in which a first electrode, a first buffer layer, a rectifying layer, a second buffer layer, and a second electrode are stacked in this order, wherein the rectifying layer includes a first silicon nitride layer having a high nitrogen content and second silicon nitride layers having a lower nitrogen content than the first silicon nitride layer, and the second silicon nitride layers are in contact with the first buffer layer and the second buffer layer, respectively, and the first silicon nitride layer is sandwiched between the second silicon nitride layers.

Moreover, according to another aspect of the present invention, provided is:

a switching element, which is provided in a signal path of a logic circuit and which includes at least one rectifying element and two variable resistance elements, wherein the rectifying element is the aforementioned rectifying element.

Advantageous Effects of Invention

According to the present invention, the ON current of a rectifying element can be increased. As a result, a switching element including the rectifying element can perform writing on ON resistance that can be expected to be highly reliable. Moreover, the rectifying element can keep the OFF-state highly resistant and thus can suppress a sneak current during operation and writing. Accordingly, a logic (programmable) circuit including a switching element capable of attaining high reliability at low ON resistance can be realized, and a highly reliable, small-area/low-power-consumption, low-cost programmable logic can be provided.

BRIEF DESCRIPTION OF DRAWINGS

FIG. 10-1 is a cross-sectional schematic diagram showing the steps of manufacturing the 4-terminal switch with a rectifying function in a multilayer wiring of the Embodiment 2 in the second example embodiment.

FIG. 10-2 is a cross-sectional schematic diagram showing the steps of manufacturing the 4-terminal switch with a rectifying function in the multilayer wiring of the Embodiment 2 in the second example embodiment.

FIG. 10-3 is a cross-sectional schematic diagram showing the steps of manufacturing the 4-terminal switch with a rectifying function in the multilayer wiring of the Embodiment 2 in the second example embodiment.

DESCRIPTION OF EMBODIMENTS

First Example Embodiment

Figure 1:
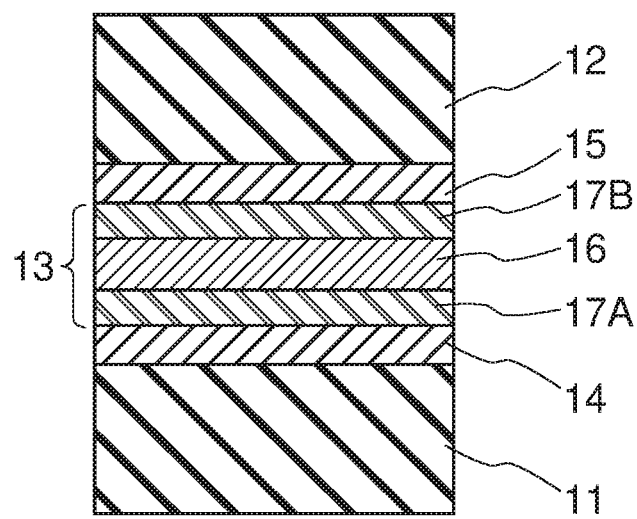
FIG. 1 is a cross-sectional schematic diagram showing one configurational example of a rectifying element of a first example embodiment.

The configuration of the "rectifying element" of the first example embodiment will now be described. FIG. 1 is a cross-sectional schematic diagram showing one configurational example of the "rectifying element" of the first example embodiment.

The rectifying element is configured to include a first electrode 11, a first buffer layer 14 in contact with the first electrode 11, a rectifying layer 13 in contact with the first buffer layer 14, a second buffer layer 15 in contact with the rectifying layer 13, and a second electrode 12 in contact with the second buffer layer 15. The first buffer layer 14, the second buffer layer 15, and the rectifying layer 13 are high-resistance films, and by applying a voltage between the first electrode 11 and the second electrode 12, the conducting state of the rectifying element can be changed in a nonlinear manner. The conducting state of the rectifying element can be suitably changed by inserting the first buffer layer 14 and the second buffer layer 15, thus making it possible to obtain excellent rectifying characteristics.

The first electrode 11 and the second electrode 12 are composed of a metal nitride. In particular, nitrides of titanium and tantalum are preferable, which are stable in air, are unlikely to form an oxide film, and have barrier properties against oxygen and copper ions. When there are an oxide film of the first electrode 11 at the interface between the first electrode 11 and the first buffer layer 14 and an oxide film of the second electrode 12 at the interface between the second electrode 12 and the second buffer layer 15, the dielectric breakdown voltage deteriorates due to a reduced ON current of the rectifying element and defects of the oxide films.

A sputtering method is desirably used to form the first electrode 11 and the second electrode 12. In the case of forming a metal nitride film using a sputtering method, a reactive sputtering method is preferably used in which a metal target is evaporated by using a plasma of a mixed gas of nitrogen and argon. A metal evaporated from the metal target reacts with nitrogen and becomes a metal nitride film on the substrate. When forming a film by a sputtering method, the proportion (flow ratio) of argon gas to nitrogen gas is desirably 50% or more. In the case of titanium in particular, the proportion of argon gas to nitrogen gas to be 50% or more enables the proportion of nitrogen in titanium nitride to be 50 atm % or less. An increased nitrogen content of titanium nitride results in an increased specific resistance and an increased contact resistance between the electrodes and amorphous silicon serving as the first and second buffer layers. In an electrode composed of metal nitride, a reduced nitrogen content results in a reduced contact resistance and an increased current when the rectifying element is ON-state, contributing to suitable rectifying characteristics. The first electrode 11 and the second electrode 12 desirably have a film thickness of 5 nm or more, and, for example, are formed into a 10 nm film.

The first buffer layer 14 and the second buffer layer 15 are formed to mitigate band offset between the rectifying layer 13 and the first electrode 11 as well as the second electrode 12, and enhance conductivity when ON-state. Accordingly, as for a suitable buffer layer configuration, the work functions of the first buffer layer 14 and the second buffer layer 15 are preferably greater than the work functions of the first electrode 11 and the second electrode 12. In addition, the work functions of the first buffer layer 14 and the second buffer layer 15 are preferably smaller than the work function of the rectifying layer 13. This configuration enables the current of low voltage application to be kept low.

Figure 2:
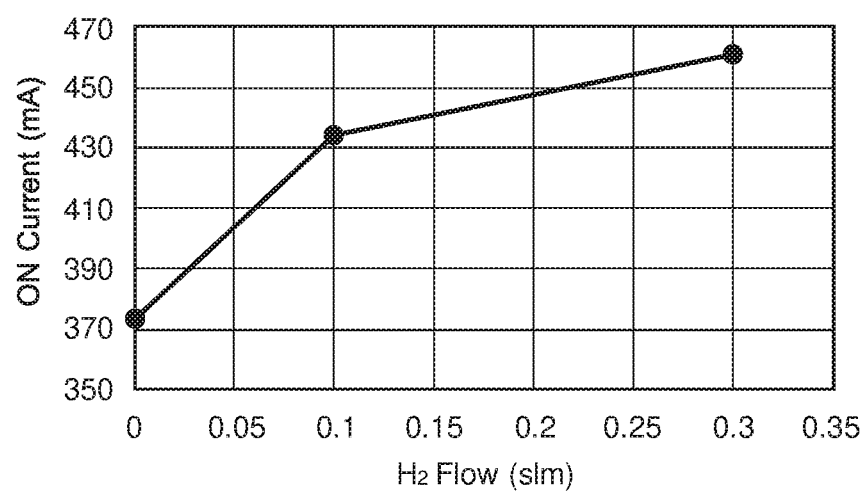
FIG. 2 is a diagram showing a relationship between the flow rate of hydrogen gas during the formation of an amorphous silicon film of the rectifying element of the first example embodiment and the ON current of the rectifying element.

The first buffer layer 14 and the second buffer layer 15 are composed of amorphous silicon and can be deposited by a plasma CVD method using silane as a source gas. For example, 100 to 300 sccm of silane ($SiH_4$) gas is introduced and argon (Ar) gas in the range of 1 to 2 slpm and helium (He) gas in 1 to 2 slpm are introduced into a parallel-plate plasma CVD reactor for 300 mm wafers in which the substrate temperature is retained in the range of 350 to 400° C., and 5 nm of an amorphous silicon film is deposited at a pressure of 300 to 600 Pa by applying a RF power of 50 to 200 W to the shower head. Hydrogenation of amorphous silicon can be promoted by introducing hydrogen gas in addition to the above gases into the CVD reactor during film formation. Amorphous silicon is likely to produce dangling bonds resulting from broken covalent bonds between silicon atoms. Although parts of dangling bonds are terminated with silane hydrogen, dangling bonds that are not terminated may form a deep trap level. When this trap captures a carrier, some of the ON current is limited. Promoting hydrogen termination of dangling bonds to reduce a deep trap level and to thus facilitate hopping conduction enhances the ON current. As for the effect of the amount of hydrogen in amorphous silicon, FIG. 2 shows the influence of the flow rate of hydrogen gas during CVD film formation on current-voltage characteristics solely of amorphous silicon. An increased flow rate of hydrogen gas results in an increased ON current.

The rectifying layer 13 is composed of silicon nitride. As for the formation of silicon nitride, silicon nitride can be deposited by a plasma CVD method using silane and nitrogen ($N_2$) gases. For example, 30 to 400 sccm of silane gas is introduced and 1000 sccm of nitrogen gas are introduced into a parallel-plate plasma CVD reactor in which the substrate temperature is retained in the range of 350 to 400° C., and 8 nm of a silicon nitride film can be deposited at a pressure of 600 Pa by applying a RF power of 200 W to the shower head.

Figure 3:
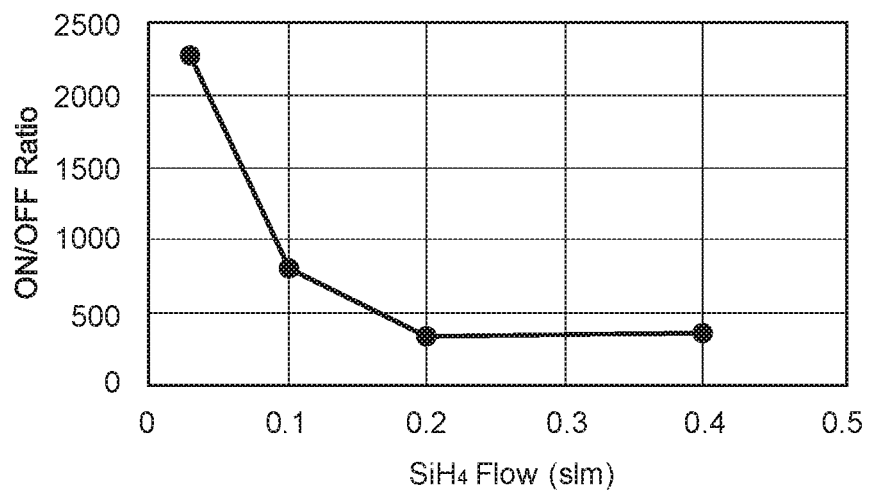
FIG. 3 is a diagram showing a relationship between the flow rate of silane gas during the formation of a silicon nitride film of the rectifying element of the first example embodiment and the ON/OFF ratio of the rectifying element.

The rectifying layer 13 is a layer responsible for the rectifying characteristics of the rectifying element, and shows insulating properties during low voltage application and conducting properties during high voltage application. Conductivity is exerted by a tunnel effect during high voltage application, and therefore the silicon nitride film that provides the tunnel effect is desirably a thin film. On the other hand, an excessively thin rectifying layer results in an increased leakage current, and therefore the specific resistance of the silicon nitride film that provides the tunnel effect is desirably high. However, an increased specific resistance of a silicon nitride film results in a large band offset between the first and second buffer layers, thus limiting some of the ON current during high voltage application. Accordingly, in the present invention, a layer for mitigating the band offset is provided between the silicon nitride film that provides the tunnel effect and the buffer layers. That is to say, the rectifying layer according to the present invention uses a first silicon nitride layer 16 having an increased nitrogen content and thus an increased specific resistance, and second silicon nitride layers having a lower nitrogen content than the first silicon nitride layer 16 and thus a smaller band gap with the buffer layers than the first silicon nitride layer 16. The second silicon nitride layers 17A and 17B are in contact with the first buffer layer and the second buffer layer, respectively, and the first silicon nitride layer 16 is sandwiched between the second silicon nitride layers 17A and 17B. The nitrogen content of the first silicon nitride layer 16 that provides the tunnel effect is preferably 50 atm % or more. A film having a value close to stoichiometry represented by $Si_3N_4$ (about 57 atom %) is more preferable. Adjustment of the band gap of the second silicon nitride layers 17A 17B is performed by making the nitrogen content in the second silicon nitride layers lower than that of the first silicon nitride layer. The nitrogen content of the second silicon nitride layers 17A and 17B is preferably 50 atm % or less. When the nitrogen content of the first silicon nitride layer 16 is 50 atm %, the nitrogen content of the second silicon nitride layers 17A and 17B is less than 50 atm %. Specifically, when depositing the rectifying layer by a plasma CVD method, the flow rate of silane gas introduced into a CVD reactor is 5% or less of the flow rate of nitrogen gas during the formation of the first silicon nitride layer 16, and the flow rate of silane gas is 30% or more of the flow rate of nitrogen gas during the formation of the second silicon nitride layers 17A and 17B. For example, assuming that the flow rate of nitrogen gas is 1000 sccm, the flow rate of silane gas during the formation of the first silicon nitride layer 16 is about 30 sccm to 50 sccm, and the flow rate of silane gas during the formation of the second silicon nitride layers and 17A and 17B is about 300 sccm to 400 sccm. As a result, the nitrogen content in the first silicon nitride layer 16 can be 50 atm % or more, and the nitrogen content in the second silicon nitride layers 17A and 17B can be 50 atm % or less. As for the effect of the nitrogen content of silicon nitride, FIG. 3 shows the influence of the flow rate of silane gas during CVD film formation on the current-voltage characteristics of silicon nitride alone. Titanium nitride in which 20 sccm of nitrogen gas was introduced was used for the electrode. A reduced flow rate of silane gas results in a suppressed OFF leakage current and an increased ON/OFF ratio. The thickness of the first silicon nitride layer 16 is, for example, 4 nm, and the thickness of each second silicon nitride layer 17A and 17B is, for example, 2 nm. The nitrogen content in silicon nitride constituting the rectifying layer 13 may be changed in a stepwise manner, or may be changed continuously. Moreover, the first silicon nitride layer 16 and the second silicon nitride layers 17A and 17B may have a gradient in nitrogen content. In either case, in the thickness direction, the high nitrogen content side based on a nitrogen content of 50 atm % can be regarded as the first silicon nitride layer 16, and the low nitrogen content side can be regarded as the second silicon nitride layers 17A and 17B.

It is preferable that the formation of the first buffer layer 14, the rectifying layer 13, and the second buffer layer 15 is successively performed in a CVD reactor without exposure to air.

Figure 4:
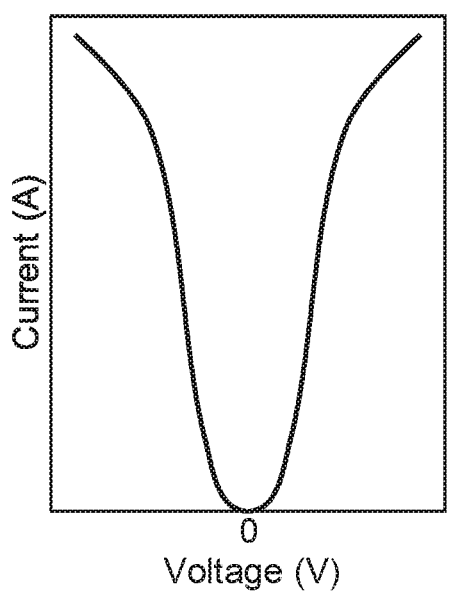
FIG. 4 is a schematic diagram showing the current-voltage characteristics of the rectifying element of the first example embodiment.

A method for driving the rectifying element of the present example embodiment will now be described with reference to FIG. 4. FIG. 4 shows a conceptual diagram of the current-voltage characteristics of the rectifying element.

When a voltage is applied across the first electrode 11 and the second electrode 12, current-voltage characteristics are exhibited that are nonlinear and symmetrical at the positive and negative electrodes via the first buffer layer 14, the rectifying layer 13, and the second buffer layer 15. While a high resistance is exhibited in a low voltage region, the current is exponentially increased as the applied voltage is increased. The resistance change is not kept nonvolatile, and when voltage application is stopped, the low resistance state is immediately cancelled in a volatile manner.

Embodiment 1

The effect of the "rectifying element" set forth in the above first example embodiment will now be described in reference to FIG. 5. The element configuration will be described in accordance with the terms set forth in FIG. 1.

FIG. 5 shows the current-voltage characteristics of the rectifying element. When the first electrode 11 is grounded, and a negative voltage is applied to the second electrode 12, nonlinear current-voltage characteristics via the first buffer layer 14, the rectifying layer 13, and the second buffer layer 15 are exhibited.

Figure 5C:
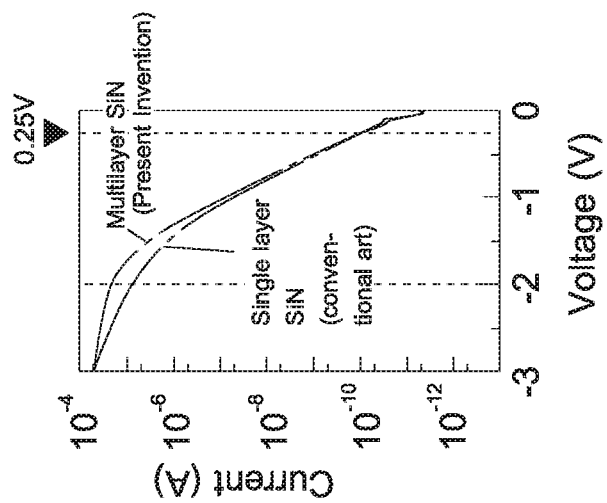
FIG. 5C is a diagram comparing the current-voltage characteristics of rectifying elements in which a multilayer rectifying layer of the first example embodiment and a conventional monolayer rectifying layer are used.
Figure 5B:
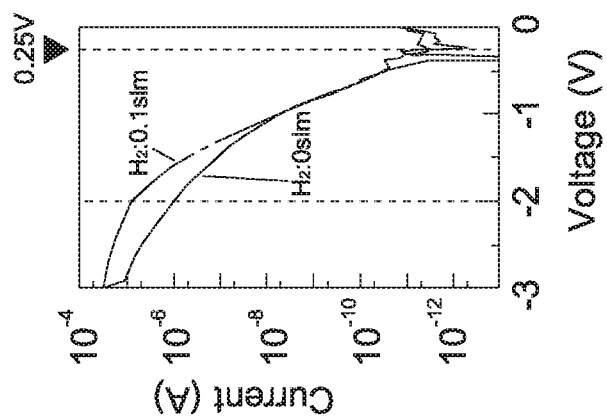
FIG. 5B is a current-voltage characteristics diagram obtained when the flow rate of hydrogen gas during the formation of an amorphous silicon film is changed.
Figure 5A:
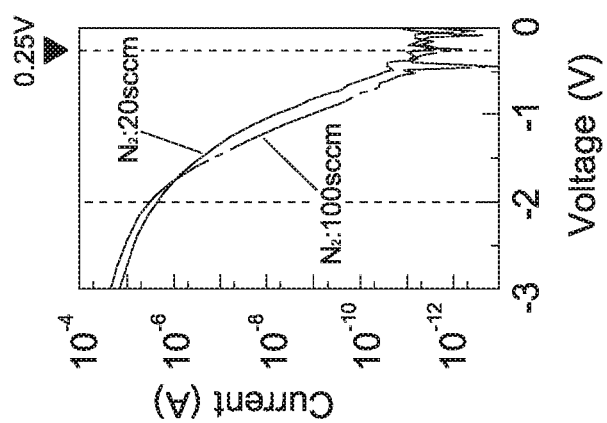
FIG. 5A is a current-voltage characteristics diagram obtained when the flow rate of nitrogen gas during the formation of a titanium nitride electrode film in the rectifying element of the first example embodiment is changed.

As for the effect of nitrogen in the titanium nitride electrode, FIG. 5A shows the influence of the flow rate of nitrogen gas during sputtering film formation on current-voltage characteristics. Reducing the flow rate of nitrogen gas from 100 sccm to one fifth thereof, i.e., 20 sccm, resulted in an ON current (when 2 V) of 1.4 times and an ON/OFF ratio of 4.2 times without increasing the OFF leakage current (when 0.25 V).

As for the effect of adding hydrogen to amorphous silicon serving as the buffer layers, FIG. 5B shows the influence of the flow rate of hydrogen gas during CVD film formation on current-voltage characteristics. Titanium nitride in which 100 sccm of nitrogen gas was introduced was used for the electrode. Introducing nitrogen gas resulted in an ON current (when 2 V) of 7.8 times and an ON/OFF ratio of 24 times without increasing the OFF leakage current (when 0.25 V).

As for the effect of stacking the first silicon nitride layer 16 and the second silicon nitride layers 17A and 17B of the present invention, FIG. 5C shows a comparison of current-voltage characteristics with those of a rectifying element in which a conventional single silicon nitride layer is used. For the conventional rectifying layer, silicon nitride formed into a film by introducing 200 sccm of silane gas and 1000 sccm of nitrogen gas into a CVD reactor is used. For the electrode, titanium nitride obtained by introducing 20 sccm of nitrogen gas as discussed in connection with FIG. 5A was used. The use of the rectifying layer having the configuration of the present invention resulted in an ON current (when 2 V) of 2.9 times and an ON/OFF ratio of 3.4 times the conventional rectifying element without increasing the OFF leakage current (when 0.25 V).

Even when the nitrogen content of electrode titanium nitride is reduced, the effect shown in FIG. 5A deteriorates if titanium in titanium nitride diffuses into amorphous silicon. Moreover, even when the nitrogen content of the first silicon nitride layer 16 is increased, the effect shown in FIG. 5C deteriorates if nitrogen diffuses into amorphous silicon. On the other hand, as hydrogen termination of dangling bonds progresses in amorphous silicon, defects in amorphous silicon are reduced, and titanium in titanium nitride and nitrogen in silicon nitride become unlikely to diffuse. That is to say, due to the combined effect of reduction of the nitrogen composition in titanium nitride, hydrogenation of amorphous silicon, and compositional control of a silicon nitride film, an increased ON current and an increased ON/OFF ratio are achieved.

Second Example Embodiment

Figure 6A:
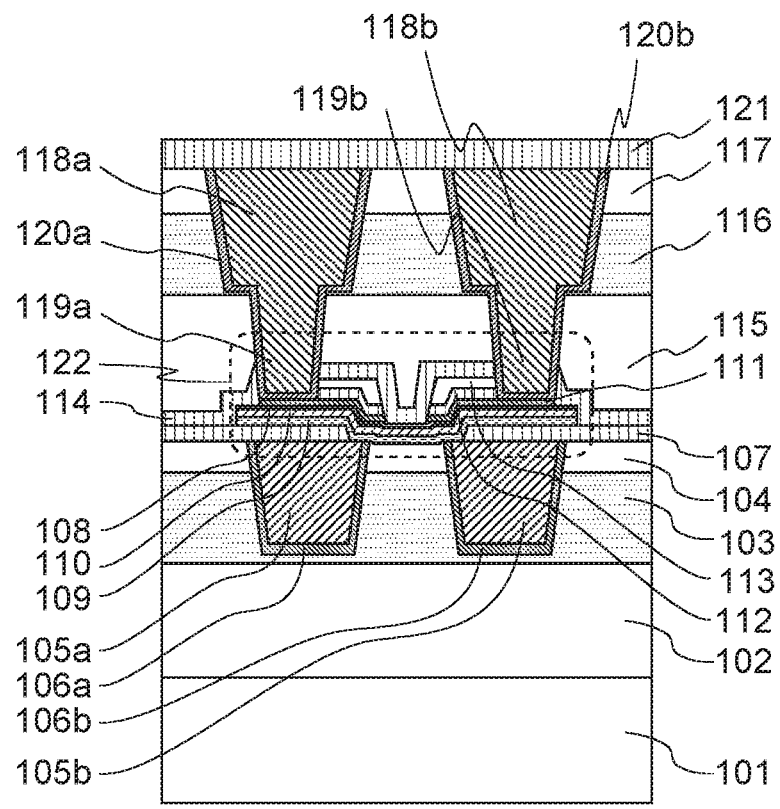
FIG. 6A is a cross-sectional schematic diagram showing one configurational example of a 4-terminal switch with a rectifying function in a multilayer wiring of a second example embodiment.
Figure 6B:
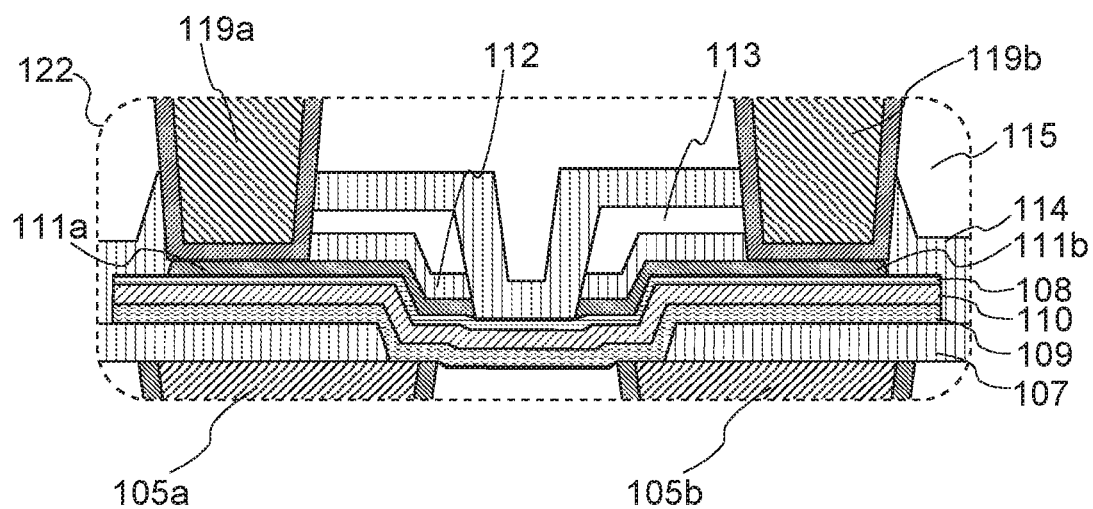
FIG. 6B is an enlarged cross-sectional diagram of a switching element in FIG. 6A.

The configuration of the "4-terminal switch with a rectifying function formed inside a multilevel interconnection"

of the second example embodiment will now be described. FIG. 6A is a cross-sectional schematic diagram showing one configurational example of a switching element employing the configuration of the "4-terminal switch with a rectifying function formed inside a multilevel interconnection" of the second example embodiment, and FIG. 6B is an enlarged cross-sectional diagram of the switching element. It is a device having the 4-terminal switch with a rectifying function (hereinafter referred to as a "4-terminal switch") 122 inside a layer of multilevel interconnection on a semiconductor substrate 101. The 4-terminal switch 122 includes two rectifying elements and two variable resistance elements.

The multilevel interconnection has an insulating laminate obtained by stacking an interlayer insulating film 102, a low-k film 103, an interlayer insulating film 104, a barrier insulating film 107, a protective insulating film 114, an interlayer insulating film 115, a low-k film 116, an interlayer insulating film 117, and a barrier insulating film 121 in this order on the semiconductor substrate 101. In the multilevel interconnection, a 1st wiring A 105a and a 1st wiring B 105b are buried in wiring grooves formed in the interlayer insulating film 104 and the low-k film 103 via a 1st barrier metal A 106a and a 1st barrier metal B 106b. In the multilevel interconnection, a 2nd wiring A 118a and a 2nd wiring B 118b are buried in wiring grooves formed in the interlayer insulating film 117 and the low-k film 116, and a via A 119a and a via B 119b are buried in pilot holes formed in the interlayer insulating film 115, the protective insulating film 114, a 2nd hard mask film 113, and a 1st hard mask film 112. The 2nd wiring A 118a and the via A 119a, and the 2nd wiring B 118b and the via B 119b, are integrated, and the side surfaces and the bottom surfaces of the 2nd wiring A 118a and the via A 119a and of the 2nd wiring B 118b and the via B 119b are covered with a 2nd barrier metal A 120a and a 2nd barrier metal B 120b.

Concerning the multilevel interconnection, at an opening formed in the barrier insulating film 107, the 4-terminal switch 122 in which an ion conductive layer 109, a 2nd electrode 110, a rectifying element stack 108, and a 3rd electrode 111 are stacked in this order is formed on the 1st wiring A 105a and the 1st wiring B 105b serving as the 1st electrode, the interlayer insulating film 104 sandwiched between the 1st wiring A 105a and the 1st wiring B 105b, the wall surface of the opening of the barrier insulating film 107, and the barrier insulating film 107; the 1st hard mask film 112 and the 2nd hard mask film 113 are formed on the 3rd electrode 111; and the upper surface and the side surface of the laminate of the ion conductive layer 109, the 2nd electrode 110, the rectifying element stack 108, the 3rd electrode 111, the 1st hard mask film 112, and the 2nd hard mask film 113 is covered with the protective insulating film 114.

Configuring a part of the 1st wiring A 105a and the 1st wiring B 105b to be a lower electrode of the 4-terminal switch 122 enables the number of steps to be reduced and the electrode resistance to be lowered. Merely by creating at least a 3 PR mask set as an additional step of a conventional copper damascene wiring process, the 4-terminal switch 122 can be provided in the same wiring layer, thus making it possible to simultaneously achieve a reduced resistance and a low cost of an element.

In the 4-terminal switch 122, the ion conductive layer 109 is in direct contact with the 1st wiring A 105a and the 1st wiring B 105b in the region of the opening formed in the barrier insulating film 107, and the metal constituting a part of the ion conductive layer 109 diffuses into the 1st wiring A 105a and the 1st wiring B 105b to form an alloy layer.

The 4-terminal switch 122 has the rectifying element stack 108 on the 2nd electrode 110, and the upper surface of the rectifying element stack 108 is in contact with the 3rd electrode 111. The 3rd electrode 111 is electrically separated into two regions by etching (the 3rd electrode A 111a and the 3rd electrode B 111b of FIG. 6B). In this case, the rectifying element stack 108 may be separated, or may not be separated, into two as is the 3rd electrode 111. On the 3rd electrode 111, the 1st hard mask film 112 and the 2nd hard mask film 113, which are separated as is the 3rd electrode 111, remain. The 2nd hard mask film 113 may not remain. In the 4-terminal switch 122, the via A 119a and the via B 119b are electrically connected to the 3rd electrode 111 via the 2nd barrier metal A 120a and the 2nd barrier metal B 120b on the 3rd electrode 111. The 4-terminal switch 122 performs ON/OFF control by applying a voltage, or allowing a current to flow, across the 2nd electrode 110 and the 1st wiring A 105a via the rectifying element stack 108, and, for example, performs ON/OFF control by utilizing electrodiffusion of metal ions supplied from the metal that forms the 1st wiring A 105a and the 1st wiring B 105b to the ion conductive layer 109. At this time, the ON resistance is determined by the current in the rectifying element stack 108.

The semiconductor substrate 101 is a substrate on which a semiconductor element is formed. For the semiconductor substrate 101, for example, a substrate such as a silicon substrate, a single crystal substrate, a SOI (silicon on insulator) substrate, a TFT (thin film transistor) substrate, or a substrate for liquid crystal production can be used. The interlayer insulating film 102 is an insulating film formed on the semiconductor substrate 101.

For the interlayer insulating film 102, for example, a silicon oxide film, or a SiOC film can be used. The interlayer insulating film 102 may be a laminate of plural insulating films.

For the low-k film 103, a low dielectric constant film (such as a SiOCH film) or the like having a lower specific dielectric constant than the silicon oxide film is used. It is an insulating film having a low dielectric constant interposed between the interlayer insulating films 102 and 104. In the low-k film 103, wiring grooves for burying the 1st wiring A 105a and the 1st wiring B 105b are formed, and the 1st wiring A 105a and the 1st wiring B 105b are buried in the wiring grooves via the 1st barrier metal A 106a and the 1st barrier metal B 106b.

The interlayer insulating film 104 is an insulating film formed on the low-k film 103. For the interlayer insulating film 104, for example, a silicon oxide film or a SiOC film can be used. The interlayer insulating film 104 may be a laminate of multiple insulating films. In the interlayer insulating film 104, wiring grooves for burying the 1st wiring A 105a and the 1st wiring B 105b are formed, and the 1st wiring A 105a and the 1st wiring B 105b are buried in the wiring grooves via the 1st barrier metal A 106a and the 1st barrier metal B 106b.

The 1st wiring A 105a and the 1st wiring B 105b are wirings buried in wiring grooves formed in the interlayer insulating film 104 and the low-k film 103 via the 1st barrier metal A 106a and the 1st barrier metal B 106b. The 1st wiring A 105a and the 1st wiring B 105b also serve as a lower electrode of the 4-terminal switch 122 and are in direct contact with the ion conductive layer 109. The upper surface of the ion conductive layer A 109a is in direct contact with the 2nd electrode 110. For the metal constituting the 1st wiring A 105*a* and the 1st wiring B 105*b*, a metal capable of diffusion and ion conduction in the ion conductive layer 109 is used, and, for example, copper can be used. The metal (e.g., copper) constituting the 1st wiring A 105*a* and the 1st wiring B 105*b* may be alloyed with aluminum.

The 1st barrier metal A 106*a* and the 1st barrier metal B 106*b* are conductive films having barrier properties that cover the side surfaces and the bottom surfaces of the wirings to prevent the metal forming the 1st wiring A 105*a* and the 1st wiring B 105*b* from diffusing into the interlayer insulating film 104 and lower layers. For the 1st barrier metal A 106*a* and the 1st barrier metal B 106*b*, for example, when the 1st wiring A 105*a* and the 1st wiring B 105*b* are composed of a metal material mainly containing copper, it is possible to use a high melting point metal or a nitride thereof such as tantalum, tantalum nitride, titanium nitride or tungsten carbonitride, or a laminated film thereof.

The barrier insulating film 107 is formed on the interlayer insulating film 104 including the 1st wiring A 105*a* and the 1st wiring B 105*b*, and has the role of preventing the oxidation of the metal (e.g., copper) forming the 1st wiring A 105*a* and the 1st wiring B 105*b*, preventing the diffusion of the metal forming the 1st wiring A 105*a* and the 1st wiring B 105*b* into the interlayer insulating film 115, and serving as an etching stop layer during the processing of the 3rd electrode 111, the rectifying element stack 108, the 2nd electrode 110, and the ion conductive layer 109. For the barrier insulating film 107, for example, a SiC film, a silicon carbonitride film, a silicon nitride film, or a laminated structure thereof can be used. The barrier insulating film 107 is preferably the same material as the protective insulating film 114 and the 1st hard mask film 112.

The ion conductive layer 109 is a film whose resistance changes (variable resistance layer). A material can be used, the resistance of which changes due to the action (e.g., diffusion and ion conduction) of metal ions produced from the metal forming the 1st wiring A 105*a* and the 1st wiring B 105*b* (lower electrode). When performing a resistance change associated with switching to an ON-state by metal deposition resulting from the reduction of metal ions, a film capable of ion conduction is used. The variable resistance layer of the variable resistance element is not limited to an ion conductive layer that conducts metal ions according to the electric field as long as a nonvolatile resistance change can be retained.

The ion conductive layer 109 can be composed of a metal-oxide ion conductive layer in contact with the 1st wiring A 105*a* and the 1st wiring B 105*b*, and a polymeric ion conductive layer in contact with the 2nd electrode 110.

The polymeric ion conductive layer can be formed using a plasma CVD method. Cyclic organosiloxane as a source material and helium as a carrier gas are introduced into a reaction chamber, and when the supply of both components is stable and the pressure of the reaction chamber is constant, application of RF power is initiated. It is possible that the source material is gasified via a source material vaporizer, and that the amount of the source material supplied is 10 to 200 sccm. Also, 500 sccm of helium can be supplied via the source material vaporizer.

The metal-oxide ion conductive layer has the role of preventing the metal forming the 1st wiring A 105*a* and the 1st wiring B 105*b* from diffusing into the polymeric ion conductive layer due to heating or a plasma during the deposition of the polymeric ion conductive layer, and the role of preventing the 1st wiring A 105*a* and the 1st wiring B 105*b* from being oxidized and becoming likely to diffuse into the polymeric ion conductive layer. For the metal forming the metal-oxide ion conductive layer, for example, zirconium, hafnium, aluminum, or titanium can be used. As for the metal-oxide ion conductive layer, a film of the constituting metal is formed, then exposed to an oxygen atmosphere under reduced pressure in a film formation chamber for the polymeric ion conductive layer, and formed into a metal oxide such as zirconium oxide, hafnium oxide, aluminum oxide, or titanium oxide, thus becoming a part of the ion conductive layer 109. The optimum thickness of the metal film that forms the metal-oxide ion conductive layer is 0.5 to 1 nm. The metal film used for forming the metal-oxide ion conductive layer may be a laminated film or a monolayer film. Formation of the metal film used for forming the metal-oxide ion conductive layer is preferably performed by sputtering. Metal atoms or ions that have received energy by sputtering enter the 1st wiring A 105*a* and the 1st wiring B 105*b*, diffuse, and form an alloy layer.

The ion conductive layer 109 is formed on the 1st wiring A 105*a*, the 1st wiring B 105*b*, the interlayer insulating film 104 sandwiched between the 1st wiring A 105*a* and the 1st wiring B 105*b*, the tapered surface formed in the opening of the barrier insulating film 107, the tapered surface of the barrier insulating film 107, and the barrier insulating film 107.

The 2nd electrode 110 is the upper electrode of the variable resistance element in the 4-terminal switch 122, and is in direct contact with the ion conductive layer 109. For the 2nd electrode 110, used is an alloy (hereinafter referred to as a ruthenium alloy) of ruthenium, which is a metal less likely to ionize than the metal forming the 1st wiring A 105*a* and the 1st wiring B 105*b* and unlikely to diffuse and conduct ions in the ion conductive layer 109, and a first metal having good adhesion to the metal forming the 1st wiring A 105*a* and the 1st wiring B 105*b*, such as titanium, tantalum, zirconium, hafnium, or aluminum. As for the first metal to be added to ruthenium, it is desirable to select a metal having a greater standard Gibbs energy of formation in the negative direction than ruthenium in the process (oxidation process) of producing metal ions from the metal. Titanium, tantalum, zirconium, hafnium, and aluminum, which have a greater standard Gibbs energy of formation in the negative direction than ruthenium in the process (oxidation process) of producing metal ions from the metal, are more likely to spontaneously undergo a chemical reaction than ruthenium and are thus highly reactive. Accordingly, in the 2nd electrode 110, alloying with ruthenium enhances adhesion to a metal bridge formed of the metal forming the 1st wiring A 105*a* and the 1st wiring B 105*b*. On the other hand, the use of only the first metal such as titanium, tantalum, zirconium, hafnium, or aluminum without including ruthenium results in a high reactivity, and transition to an "OFF" state is not achieved. Transition from an "ON" state to an "OFF" state proceeds with the oxidation reaction (dissolution reaction) of a metal bridge, and when the metal constituting the 2nd electrode 110 has a greater standard Gibbs energy of formation in the negative direction in the process (oxidation process) of producing metal ions from the metal than the metal forming the 1st wiring A 105*a* and the 1st wiring B 105*b*, the oxidation reaction of the metal constituting the 2nd electrode 110 proceeds more than the oxidation reaction of the metal bridge formed of the metal forming the 1st wiring A 105*a* and the 1st wiring B 105*b* does, and therefore transition to the "OFF" state cannot be achieved. Accordingly, the metal material used for forming the metal constituting the 2nd electrode 110 needs to be an alloy with ruthenium, which has a smaller standard Gibbs energy of formation in the process (oxidation process) of producing metal ions from the metal in the negative direction than copper. Furthermore, when copper, which is a component of a metal bridge, is concomitantly present in the metal constituting the 2nd electrode 110, the effect of adding a metal having a large standard Gibbs energy of formation in the negative direction is reduced, and therefore the first metal added to ruthenium is preferably a material having barrier properties against copper and copper ions, such as tantalum or titanium. On the other hand, it has been discovered that the greater the amount of the first metal added is, the more stabilized the "ON" state is, and it has been discovered that the addition of the metal even in 5 atm % enhances stability. In particular, titanium as the first metal provides excellent transition to OFF-state and excellent ON-state stability. In particular, the metal constituting the 2nd electrode 110 is an alloy of ruthenium and titanium, and the titanium content is preferably 10 atm % or more and 40 atm % or less, and more preferably in the range of 20 atm % to 30 atm %. The ratio of ruthenium content in the ruthenium alloy is preferably 60 atm % or more and 90 atm % or less, and more preferably in the range of 70 atm % to 80 atm %.

For the formation of the ruthenium alloy, a sputtering method is desirably used. Examples of forming a film of the alloy by a sputtering method include a method involving an alloy target of ruthenium and the first metal, a co-sputtering method involving simultaneously sputtering a ruthenium target and a first metal target in the same chamber, and an intermixing method involving forming a thin film of the first metal in advance, forming a film of ruthenium thereon by a sputtering method, and forming an alloy by the energy of colliding atoms. The use of the co-sputtering method and the intermixing method enables the alloy composition to be altered as desired. When employing the intermixing method, a heat treatment at 400° C. or lower is preferably performed for "leveling" the mixed state after completing the formation of a ruthenium film.

The 2nd electrode 110 desirably has a two-layer structure. Assuming that the 2nd electrode 110 in contact with the ion conductive layer 109 is a ruthenium alloy, the side in contact with the rectifying element stack 108 is the lower electrode (one of the first electrode 11 and the second electrode 12) of the rectifying element. Accordingly, as described in the first example embodiment, it is preferably composed of a metal nitride. In particular, nitrides of titanium and tantalum are preferable, which are stable in air, are unlikely to form an oxide film, and have barrier properties against oxygen and copper ions. When there is an oxide film, the dielectric breakdown voltage deteriorates due to a reduced ON current of the rectifying element and defects of the oxide film. A titanium nitride or tantalum nitride film can be formed consistently under a vacuum by sputtering film formation on the upper layer of the ruthenium alloy layer without exposure to air from the formation of a ruthenium alloy film. When performing nitridation, nitrogen is introduced into a chamber, and a nitride film is formed by a reactive sputtering method. When forming a titanium nitride or tantalum nitride film by a sputtering method, a reactive sputtering method is preferably used in which a metal target is evaporated by using a plasma of a mixed gas of nitrogen and argon. The metal evaporated from the metal target reacts with nitrogen and becomes a metal nitride film on the substrate. When forming a film by a sputtering method, the proportion of argon gas to nitrogen gas is desirably 50% or more. In the case of titanium in particular, controlling the proportion of argon gas to nitrogen gas to be 50% or more enables the proportion of nitrogen in titanium nitride to be 50% or less. An increased nitrogen content of titanium nitride results in an increased specific resistance and an increased contact resistance between the electrode and amorphous silicon. In an electrode composed of a metal nitride, a reduced nitrogen content results in a reduced contact resistance and an increased current when the rectifying element is ON, thus contributing to suitable rectifying characteristics.

The rectifying element stack 108 is a layer having a bipolar rectifying effect, and is characterized by a nonlinearly increasing current relative to the applied voltage. The rectifying element stack 108 is a laminate of amorphous silicon that is the first buffer layer, silicon nitride that is the rectifying layer, and amorphous silicon that is the second buffer layer as described in the first example embodiment, and thus exerts excellent nonlinearity.

The 3rd electrode 111 is an electrode serving as the upper electrode (the other of the first electrode 11 and the second electrode 12) of the rectifying element, and is composed of a metal nitride. The 3rd electrode 111 can also be formed in the same manner as the first electrode 11 and the second electrode 12 as described in the first example embodiment.

The 1st hard mask film 112 is a film serving as a hard mask film as well as a passivation film when etching the 3rd electrode 111, the 2nd electrode 110, the rectifying element stack 108, and the ion conductive layer 109. For the 1st hard mask film 112, for example, a silicon nitride film, a silicon oxide film, or a laminate thereof can be used. The hard mask film 112 preferably contains the same materials as the protective insulating film 114 described below and the barrier insulating film 107.

The 2nd hard mask film 113 is a film serving as a hard mask film when etching the 3rd electrode 111, the 2nd electrode 110, the rectifying element stack 108, and the ion conductive layer 109. For the 2nd hard mask film 113, for example, a silicon nitride film, a silicon oxide film, or a laminate thereof can be used.

In order to form the 4-terminal switch equipped with a rectifying element 122, the ion conductive layer 109, the 2nd electrode 110, the rectifying element stack 108, the 3rd electrode 111, the 1st hard mask film 112, the 2nd hard mask film 113 are formed on the barrier insulating film 107. Thereafter, in a manner of transferring the shape of the 2nd hard mask 113 formed by performing patterning and etching twice to the 4-terminal switch equipped with a rectifying element 122 portion, two rectifying elements are separated through a single etching step and formed on the 2nd electrode 110. In the initial patterning of two patterning operations, the resist of a region where the rectifying element stack 108 is to be maintained is maintained, and the thickness of the 2nd hard mask 113 is partially processed, specifically, about 60% is processed. Thereafter, in the second patterning, the resist of a region where the 4-terminal switch equipped with a rectifying element 122 is to be formed, including the region where the rectifying stack 108 is to be maintained, is maintained, and the remaining thickness of the 2nd hard mask 113 is processed.

The protective insulating film 114 is an insulating film having the function to further prevent oxygen from desorbing from the ion conductive layer 109 without damaging the 4-terminal switch equipped with a rectifying element 122. For the protective insulating film 114, for example, a silicon nitride film or a silicon carbonitride film can be used. The protective insulating film 114 is preferably the same material as the 1st hard mask film 112 and the barrier insulating film 107. In the case of the same material, the protective insulating film 114, the barrier insulating film 107, and the 1st hard mask film 112 are integrated, thus adhesion of the interface is enhanced, and the 4-terminal switch equipped with a rectifying element 122 can be further protected.

The interlayer insulating film 115 is an insulating film formed on the protective insulating film 114. For the interlayer insulating film 115, for example, a silicon oxide film or a SiOC film can be used. The interlayer insulating film 115 may be a laminate of plural insulating films. The interlayer insulating film 115 may be the same material as the interlayer insulating film 117. In the interlayer insulating film 115, pilot holes for burying the via A 119a and the via B 119b are formed, and the via A 119a and the via B 119b are buried in the pilot holes via the 2nd barrier metal A 120a and the 2nd barrier metal B 120b.

For the low-k film 116, a low dielectric constant film (e.g., a SiOCH film) or the like having a specific dielectric constant lower than the silicon oxide film is used. It is an insulating film having a low dielectric constant interposed between the interlayer insulating films 115 and 117. In the low-k film 116, wiring grooves for burying the 2nd wiring A 118a and the 2nd wiring B 118b are formed, and the 2nd wiring A 118a and the 2nd wiring B 118b are buried in the wiring grooves via the 2nd barrier metal A 120a and the 2nd barrier metal B 120b.

The interlayer insulating film 117 is an insulating film formed on the low-k film 116. For the interlayer insulating film 117, for example, a silicon oxide film, a SiOC film, or a low dielectric constant film (e.g., a SiOCH film) having a specific dielectric constant lower than the silicon oxide film can be used. The interlayer insulating film 117 may be a laminate of plural insulating films. The interlayer insulating film 117 may be the same material as the interlayer insulating film 115. In the interlayer insulating film 117, wiring grooves for burying the 2nd wiring A 118a and the 2nd wiring B 118b are formed, and the 2nd wiring A 118a and the 2nd wiring B 118b are buried in the wiring grooves via the 2nd barrier metal A 120a and the 2nd barrier metal B 120b.

The 2nd wiring A 118a and the 2nd wiring B 118b are wirings buried in wiring grooves formed in the interlayer insulating film 117 and the low-k film 116 via the 2nd barrier metal A 120a and the 2nd barrier metal B 120b. The 2nd wiring A 118a and the 2nd wiring B 118b are integrated with the via A 119a and the via B 119b. Concerning the via A 119a, the via B 119b, the via A 119a and the via B 119b are buried in pilot holes formed in the interlayer insulating film 115, the protective insulating film 114, the 1st hard mask film 112 and the 2nd hard mask film 113 via the 2nd barrier metal A 120a and the 2nd barrier metal B 120b. The via A 119a and the via B 119b are electrically connected to the 3rd electrode 111 via the 2nd barrier metal A 120a and the 2nd barrier metal B 120b. For the 2nd wiring A 118a, the 2nd wiring B 118b, the via A 119a, and the via B 119b, for example, copper can be used.

The 2nd barrier metal A 120a and the 2nd barrier metal B 120b are conductive films having barrier properties that cover the side surfaces and the bottom surfaces of the 2nd wiring A 118a, the 2nd wiring B 118b, the via A 119a, and the via B 119b to prevent the metal forming the 2nd wiring A 118a and the 2nd wiring B 118b (including the via A 119a and the via B 119b) from diffusing into the interlayer insulating films 115 and 117 or lower layers. For the 2nd barrier metal A 120a and the 2nd barrier metal B 120b, for example, when the 2nd wiring A 118a, the 2nd wiring B 118b, the via A 119a, and the via B 119b are composed of metal elements mainly containing copper, it is possible to use a high melting point metal or a nitride thereof such as tantalum, tantalum nitride, titanium nitride or tungsten carbonitride, or a laminate film thereof.

The barrier insulating film 121 is an insulating film formed on the interlayer insulating film 117 including the 2nd wiring A 118a and the 2nd wiring B 118b and having the role of preventing the oxidation of a metal (e.g., copper) forming the 2nd wiring A 118a and the 2nd wiring B 118b and also preventing the diffusion of the metal forming the 2nd wiring A 118a and the 2nd wiring B 118b to upper layers. For the barrier insulating film 121, for example, a silicon carbonitride film, a silicon nitride film, or a laminate structure thereof can be used.

Figure 13:
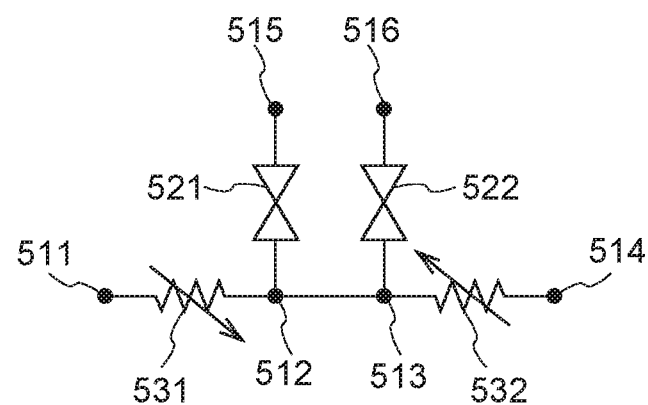
FIG. 13 is a circuit diagram of the 4-terminal switch with a rectifying function shown in the second example embodiment.

FIG. 13 is a circuit diagram illustrating one configurational example of a switching element equipped with the rectifying element of the present example embodiment (4-terminal switch with a rectifying function). As shown in FIG. 13, this switching element has two rectifying elements 521, 522 corresponding to the rectifying element shown in FIG. 1 and two variable resistance elements 531, 532. Moreover, this switching element corresponds to the 4-terminal switch 122 shown in FIGS. 6A and 6B. In FIGS. 13, 511 to 516 each denote a terminal, and four terminals 511, 514, 515, and 516 are connected to the respective wirings of the multilevel interconnect and thereby constitute the 4-terminal switch. The two variable resistance elements 531, 532 are each connected to two terminals. That is to say, the variable resistance element 531 is connected to the terminals 511 and 512, and the variable resistance element 532 is connected to the terminals 513 and 514. The variable resistance elements have an active electrode capable of releasing metal ions to form a metal bridge in the ion conductive layer and an inert electrode not releasing metal ions. The active electrode of the variable resistance element 531 is the terminal 511, and the active electrode of the variable resistance element 532 is the terminal 514. In FIG. 6, the terminal 511 is the 1st wiring A 105a, and the terminal 514 is the 1st wiring B 105b. The inactive electrode of the variable resistance element 531 is the terminal 512, and the inactive electrode of the variable resistance element 532 is the terminal 513. The terminals 512 and 513 are connected to each other. In FIG. 6, the 2nd electrode 110 is the terminals 512 and 513 connected to each other. Among the first electrode or the second electrode of each of the rectifying elements 521 and 522, one electrode is connected to the terminal 512 or 513, and the other electrode is connected to the terminal 515 or 516. The 3rd electrode A 111a in FIG. 6 is the terminal 515, and the 3rd electrode B 111b is the terminal 516.

Embodiment 1

The effect of the "4-terminal switch with a rectifying function formed inside a multilevel interconnect" set forth in the above second example embodiment will now be described in reference to FIG. 4, FIG. 7, and FIG. 9. The element configuration will be described in accordance with the terms set forth in FIG. 6 or FIG. 13.

When a voltage is applied across the 2nd electrode 110 (terminal 513) and the 3rd electrode B 111b (terminal 516), the rectifying element 521 exhibits current-voltage characteristics that are nonlinear and symmetrical at the positive and negative electrodes as shown in FIG. 4. While a high resistance is exhibited in a low voltage region, the current is exponentially increased as the applied voltage is increased. The resistance change is not kept nonvolatile, and when voltage application is stopped, the low resistance state is immediately cancelled in a volatile manner.

Figure 7:
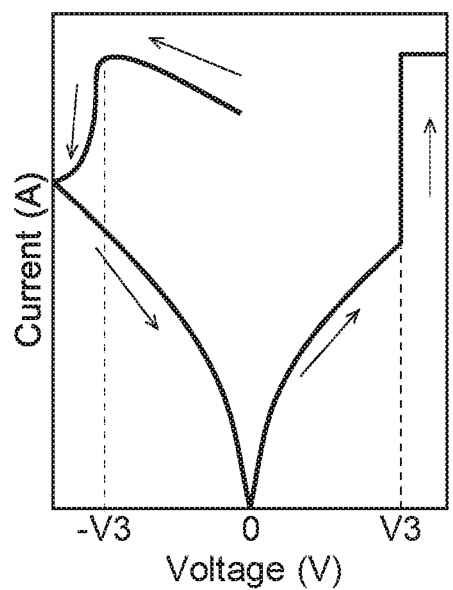
FIG. 7 is a schematic diagram showing current-voltage characteristics between the 1st wiring and the 2nd electrode of a 4-terminal switch with a rectifying function of a first embodiment in the second example embodiment.

FIG. 7 shows a conceptual diagram of current-voltage characteristics of a nonvolatile element (the variable resistance element 531) constituting the 4-terminal switch 122. When the 2nd electrode 110 (terminal 512) is grounded, and a positive voltage is applied to the 1st wiring A 105a (terminal 511), the metal (copper) constituting the 1st wiring A 105a is ionized by an electrochemical reaction and injected into the ion conductive layer 109. The injected metal ions migrate to the 2nd electrode 110 side, receive electrons, and are thus deposited in the ion conductive layer 109 as a metal bridge. When the 2nd electrode 110 and the 1st wiring A 105a are connected by the metal bridge, transition to a low resistance state (ON) is attained at V3 in FIG. 7. On the other hand, when a negative voltage is applied to the 1st wiring A 105a, the metal bridge is converted to metal ions by a dissolution reaction, the metal ions are recovered by the 1st wiring A 105a, and thus transition to a high resistance state (OFF) is attained at −V3 in FIG. 7. The resistance change is retained in a nonvolatile manner even when voltage application is stopped.

Figure 8:
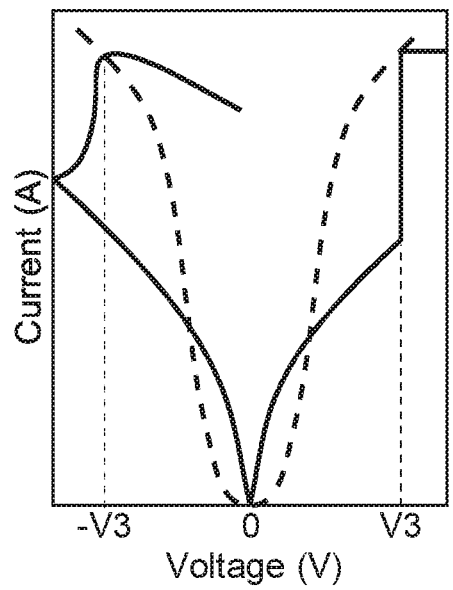
FIG. 8 is a diagram obtained by superimposing the current-voltage characteristics of FIG. 4 and FIG. 7.
Figure 9:
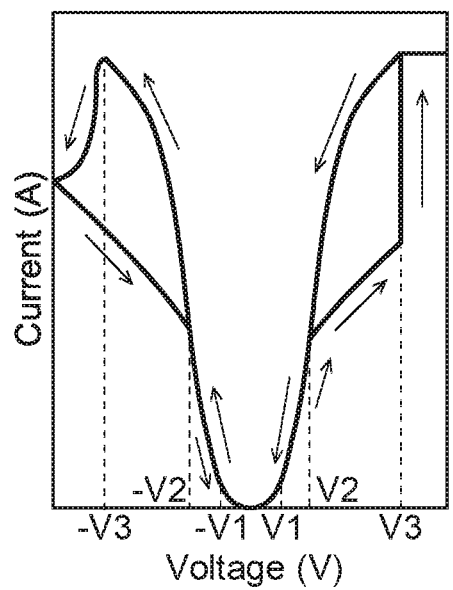
FIG. 9 is a schematic diagram showing current-voltage characteristics between the 1st wiring and the 3rd electrode of the 4-terminal switch with a rectifying function of the Embodiment 1 in the second example embodiment.

FIG. 8 and FIG. 9 show conceptual diagrams of the current-voltage characteristics between the 1st wiring A 105a (terminal 511) and the 3rd electrode B 111b (terminal 516) in contact with the via B 119b in the 4-terminal switch 122. As shown in FIG. 13, the current limiting of nonvolatile elements (variable resistance elements 531, 532) in the 4-terminal switch is performed in the rectifying elements 521, 522. Accordingly, the current-voltage characteristic of the 4-terminal switch shows characteristics obtained by combining the current-voltage characteristics of FIG. 4 and FIG. 7. FIG. 8 shows the characteristics of FIG. 4 (broken line) and FIG. 7 (solid line) superimposed on each other. When the 3rd electrode B 111b (terminal 516) in contact with the via B 119b is grounded, and a positive voltage is applied to the 1st wiring A 105a (terminal 511), current-voltage characteristics of a high resistance rectifying element are shown up to V2 where the current-voltage characteristics of FIG. 4 and FIG. 7 intersect. Accordingly, at V1 that is a voltage read in an OFF-state, the high resistance state is maintained, and a sneak current can be suppressed. From V2 up to V3 where the ion conductive layer 109 between the 1st wiring A 105a (terminal 511) and the 2nd electrode 110 (terminal 512) transitions to low resistance, the current-voltage characteristic of the high resistance nonvolatile element (variable resistance element 531) is shown, but after transition to low resistance between the 1st wiring A 105a (terminal 511) and the 2nd electrode 110 (terminal 512), the current-voltage characteristic of the rectifying element (522) is shown. On the other hand, when a negative voltage is applied to the 1st wiring A 105a, first, the current-voltage characteristics of the rectifying element (522) are shown up to −V3 where the resistance between the 1st wiring A 105a and the 2nd electrode 110 (terminal 512) transition to a high resistance, then the current-voltage characteristic of the nonvolatile switch (variable resistance element 531) are shown from −V3 to −V2 where the current-voltage characteristics of FIG. 4 and FIG. 7 intersect, and the current-voltage characteristic of the high resistance rectifying element (522) is shown from −V2 to 0V. FIG. 9 shows the current-voltage characteristics between the 1st wiring A 105a and the 3rd electrode 111 in contact with the via B 119b in the 4-terminal switch 122. The same current-voltage characteristics as described above are also shown between the 1st wiring B 105b (terminal 514) and the 3rd electrode A 111a (terminal 515) in contact with the via A 119a in the 4-terminal switch 122.

When the switching element shown in FIG. 13 is provided in a signal path of a logic circuit, one terminal of the terminals 511 and 514 plays the role of a signal input terminal, and the other terminal plays the role of a signal output terminal. Moreover, the terminals 515, 516 play the role of control terminals for programming the variable resistance elements 531, 532 to be in an ON-state or an OFF-state.

Assuming that a voltage is applied across the terminal 511 and the terminal 516, the voltage applied across the terminal 511 and the terminal 516 is distributed to the variable resistance element 531 and the rectifying element 522. For example, in order to transition (program) the resistance state of the variable resistance element 531 from an OFF-state to an ON-state (low resistance state) by a lower control voltage, most of the applied control voltage is preferably applied to the variable resistance element. Specifically, the 3rd electrode B 111b (terminal 516) in contact with the via B 119b of FIG. 6 is grounded, and a positive voltage equal to or greater than a threshold voltage (set voltage) is applied to the 1st wiring A 105a (terminal 511). On the other hand, when transitioning the variable resistance element 531 from an ON-state to an OFF state (high resistance state), the 1st wiring A 105a (terminal 511) is grounded, and a positive voltage equal to or greater than a threshold voltage (reset voltage) is applied to the 3rd electrode B 111b (terminal 516) in contact with the via B 119b. The same also applies to when applying a voltage across the terminal 514 and the terminal 515.

In the above description, the 4-terminal switch of the present example embodiment has been described as having a crossbar switch configuration, but is not limited to the crossbar switch configuration.

Embodiment 2

Figures 1, 10:
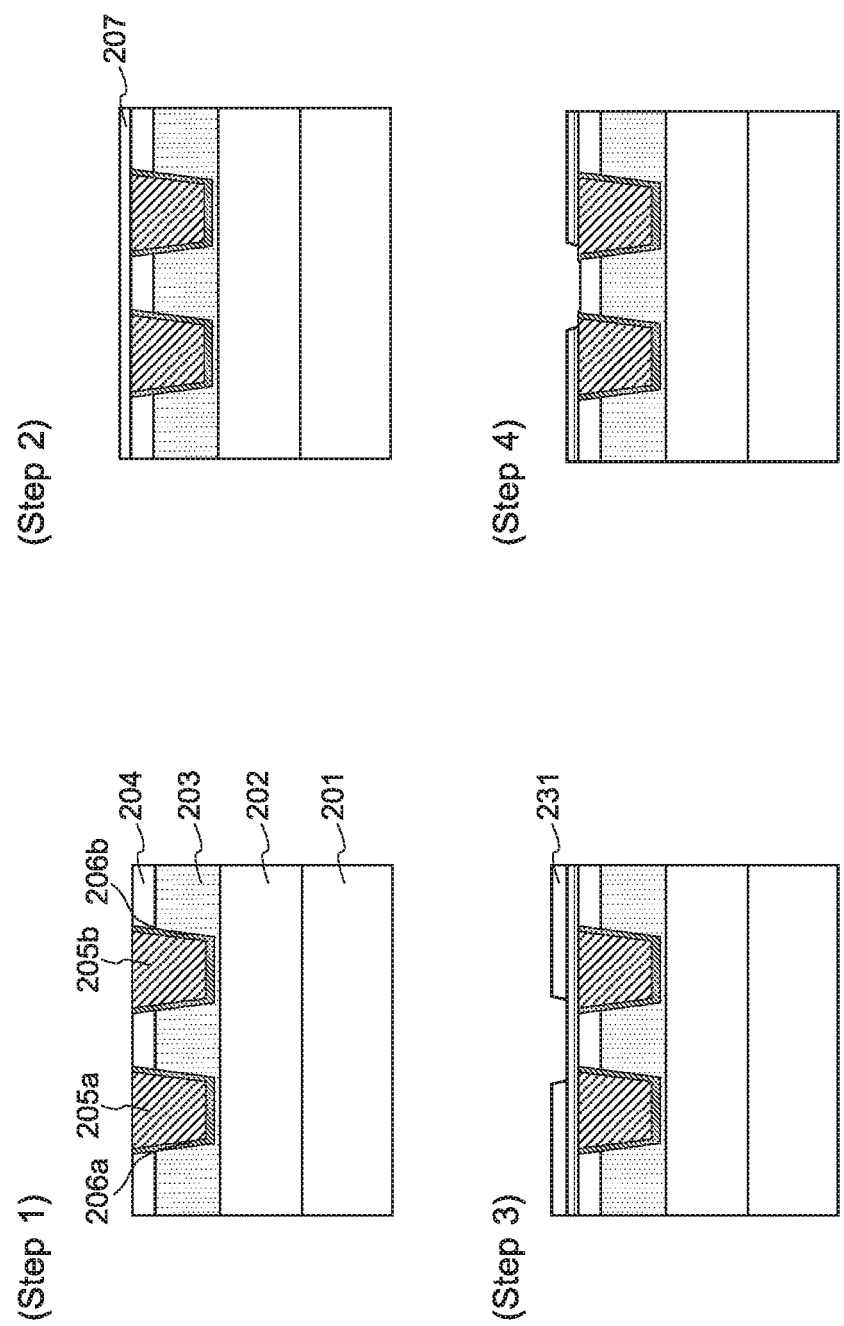
Figures 3, 10:
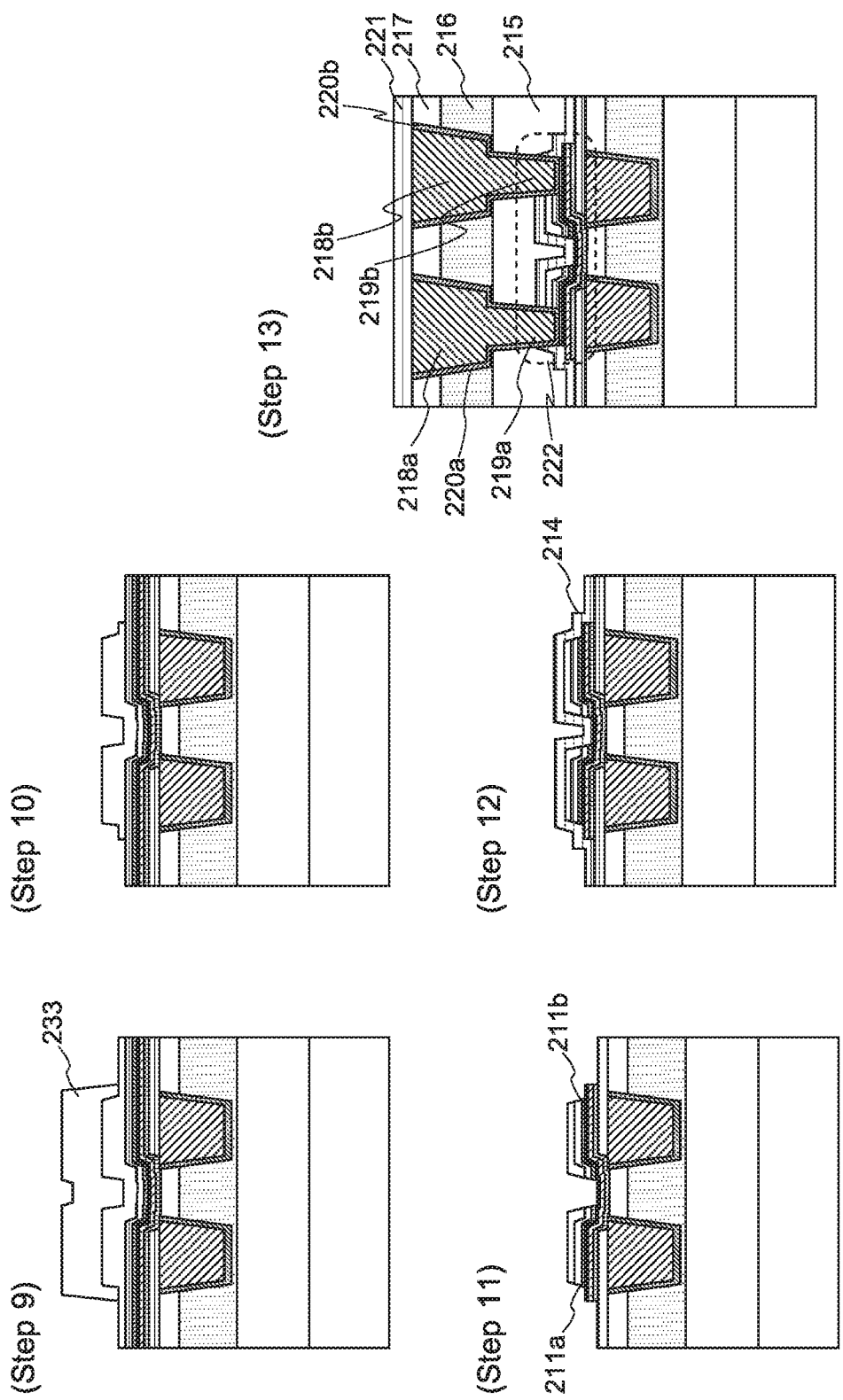

The manufacturing process of a semiconductor device in which the "4-terminal switch with a rectifying function formed inside a multilevel interconnect" described in the above second example embodiment, and, in particular, the steps of forming a switching element employing the configuration of the "4-terminal switch with a rectifying function" inside a multilevel interconnect will now be described in reference to FIG. 10.

(Step 1)

An interlayer insulating film 202 (e.g., a silicon oxide film, a thickness of 500 nm) is deposited on a semiconductor substrate 201 (e.g., a substrate on which a semiconductor element is formed), then a low dielectric constant film having a low specific dielectric constant (e.g., a SiOCH film, a film thickness of 150 nm) is deposited as a low-k film 203 on the interlayer insulating film 202, and then an interlayer insulating film 204 (e.g., a silicon oxide film, a film thickness of 100 nm) is deposited on the low-k film 203. The interlayer insulating films 202, 204 and the low-k film 203 can be formed by a plasma CVD method. Subsequently, wiring grooves (two grooves in this cross-section) are formed in the interlayer insulating film 204 and the low-k film 203 by a lithography method (including photoresist formation, dry etching, and photoresist removal). Then, a 1st wiring material (e.g., copper) is buried in the wiring grooves via a 1st barrier metal film (e.g., tantalum nitride/tantalum, a film thickness of 5 nm/5 nm). For example, after a laminate film of tantalum nitride/tantalum is formed by a PVD method, and a copper seed (not shown) is formed by a PVD method, copper is buried in wiring grooves by an electroplating method and heat-treated at a temperature of 150° C.

or higher, then an excess of copper other than that in the wiring grooves and the 1st barrier metal film are removed by a CMP method, thereby a 1st wiring A 205*a* can be formed in one groove via a 1st barrier metal A 206*a*, and a 1st wiring B 205*b* can be formed in the other groove via a 1st barrier metal B 206*b*. For such a series of copper wiring forming methods, procedures commonly used in the art can be used. Here, the CMP (Chemical Mechanical Polishing) method is a method in which irregularities of a wafer surface produced during a multilevel interconnect forming process are planarized by being brought into contact with and polished by a polishing pad rotated while allowing a polishing liquid to flow on the wafer surface. Planarization is performed by forming a buried wiring (damascene wiring) by polishing excessive copper buried in the groove, or by polishing the interlayer insulating film.

(Step 2)

A barrier insulating film 207 (e.g., a silicon nitride film or a silicon carbonitride film, a film thickness of 30 nm) is formed on the interlayer insulating film 204 including the 1st wiring A 205*a* and the 1st wiring B 205*b*. Here, the barrier insulating film 207 can be formed by a plasma CVD method. The thickness of the barrier insulating film 207 is preferably about 10 nm to 50 nm.

(Step 3)

A hard mask film 231 (e.g., a silicon oxide film, a film thickness: 40 nm) is formed on the barrier insulating film 207. At this time, from the viewpoint of retaining a high etching selectivity in dry etching processing, the hard mask film 231 is preferably a material different from the barrier insulating film 207, and may be an insulating film or a conductive film. For the hard mask film 231, for example, a silicon nitride film, a titanium nitride film, a titanium film, a tantalum film, a tantalum nitride film, or the like can be used in addition to the silicon oxide film, and a laminate of a silicon nitride film/a silicon oxide film can be used. Patterning of an opening is performed using a photoresist (not shown) on the hard mask film 231, dry etching is performed using the photoresist as a mask, and thereby an opening pattern is formed in the hard mask film 231. Then, the photoresist is removed by oxygen plasma ashing or the like. At this time, dry etching does not necessarily terminate at the upper surface of the barrier insulating film 207, and the barrier insulating film 207 may be partially etched so that dry etching reaches the inside thereof.

(Step 4)

Using the hard mask film 231 as a mask, the barrier insulating film 207 exposing from the opening of the hard mask film 231 is subjected to etch back (dry etching) to thereby form an opening in the barrier insulating film 207, thus the 1st wiring A 205*a* and the 1st wiring B 205*b* are partially exposed from the opening of the barrier insulating film 207, and then exposed to a plasma in which a mixed gas of nitrogen and argon is used, and thereby copper oxide formed on the exposed surfaces of the 1st wiring A 205*a* and the 1st wiring B 205*b* is removed and, also, etching by-products and the like produced during etch back are removed. In the etch back of the barrier insulating film 207, the use of reactive dry etching enables the wall surface of the opening of the barrier insulating film 207 to be a tapered surface. In reactive dry etching, a fluorocarbon-containing gas can be used as an etching gas. While it is preferable that the hard mask film 231 is completely removed during etch back, the hard mask film 231 may remain as-is when it is an insulating material. The 1st wirings are each preferably exposed about 5 nm to 50 nm from the opposing inner ends. The shape of the opening formed in the barrier insulating film 207 is not particularly limited, and may be any shape such as a circle or a rectangle.

(Step 5)

An ion conductive layer 209 is formed on the barrier insulating film 207 including the 1st wiring A 205*a* and the 1st wiring B 205*b*. First, 1 nm of zirconium is deposited by a sputtering method. Zirconium is oxidized during the formation of a polymeric ion conductive layer and forms a part of the ion conductive layer 209. At this time, zirconium diffuses into portions of the 1st wiring A 205*a* and the 1st wiring B 205*b* in contact with the ion conductive layer 209, and an alloy layer is formed in a self-aligning manner. Furthermore, annealing in a vacuum environment at a temperature of 350° C. enables the thickness of the alloy layer to be increased. Annealing is preferably about 2 minutes. Furthermore, a SIOCH-based polymer film containing silicon, oxygen, carbon, and hydrogen is formed as a polymeric ion conductive layer by plasma CVD. Source material cyclic organosiloxane and carrier gas helium are introduced into a reaction chamber, and when the supply of both components is stable and the pressure of the reaction chamber is constant, application of RF power is initiated. The source material is gasified in a source material vaporizer, the amount of the source gas supplied is 10 to 200 sccm, 500 sccm of helium is supplied via the source material vaporizer, and 500 sccm of helium is directly supplied to the reaction chamber through another line. Moisture and the like are attached to the opening of the barrier insulating film 207 due to exposure to air, and therefore heat treatment for degassing is preferably performed under reduced pressure at a temperature of about 250° C. to 350° C. before depositing the polymeric ion conductive layer.

An "alloy of ruthenium and titanium" is formed with a film thickness of 10 nm on the ion conductive layer 209 as a lower layer of the 2nd electrode 210 by a co-sputtering method. At this time, a ruthenium target and a titanium target are present in the same chamber, and simultaneously sputtered to deposit an alloy film. At this time, controlling the applied power to the ruthenium target to be 150 W and the applied power to the titanium target to be 50 W results in a ruthenium content in the "alloy of ruthenium and titanium" of 75 atm %. This ruthenium alloy serves as an upper electrode of the variable resistance element in the 4-terminal switch. Moreover, as an upper layer of the 2nd electrode 210, titanium nitride is formed to have a film thickness of 5 nm to 10 nm on the ruthenium alloy by a reactive sputtering method. At this time, sputtering is performed by controlling the power applied to the titanium target to be 500 W to 1 kW and introducing nitrogen gas and argon gas into the chamber. Controlling the flow ratio of nitrogen to argon to be 2:1 results in a proportion of titanium in titanium nitride of 50 atm % or more.

On the 2nd electrode 210, the first buffer layer, the rectifying layer, and the second buffer layer shown in the first example embodiment are formed as a rectifying element stack 208. Specifically, amorphous silicon, silicon nitride, and amorphous silicon are formed into films in this order by plasma CVD in which the substrate temperature is maintained in the range of 350 to 400° C. The thickness of each film is desirably 5 nm or less. For example, a 2 nm film of amorphous silicon and a 1 nm film of silicon nitride are formed. It is preferable that the films are successively formed by changing the gases to be supplied in a plasma-generated state. Amorphous silicon is deposited by introducing 100 to 300 sccm of silane gas, introducing argon gas in the range of 1 to 2 slpm and helium gas in 1 to 2 slpm, and, at a pressure of 300 to 600 Pa, applying a RF power of 50 to 200 W to the shower head. Hydrogenation of amorphous silicon can be promoted by introducing hydrogen gas in addition to the above gases into the CVD reactor during film formation. As for the formation of silicon nitride, silicon nitride can be deposited by introducing 30 to 400 sccm of silane gas and 1000 sccm of nitrogen gas and, at a pressure of 600 Pa, applying a RF power of 200 W to the shower head. As described in the first example embodiment, silicon nitride of the rectifying layer is deposited by adjusting the flow rate of silane gas such that silicon nitride where a tunnel effect is exerted (first silicon nitride layer) is sandwiched by silicon nitride having a small band gap (second silicon nitride layers). The rectifying layer is, for example, a laminate of 0.25 nm of silicon nitride having a small band gap (second silicon nitride layer), 0.5 nm of silicon nitride where a tunnel effect is exerted (first silicon nitride layer), and 0.25 nm of silicon nitride having a small band gap (second silicon nitride layer).

A titanium nitride film having a thickness of 15 nm to 25 nm is formed as a 3rd electrode 211 on the rectifying element stack 208 by a reactive sputtering method. At this time, sputtering is performed by controlling the power applied to the titanium target to be 500 W to 1 kW and introducing nitrogen gas and argon gas into the chamber. At this time, controlling the flow ratio of nitrogen and the flow rate of argon to be 2:1 results in a proportion of titanium in titanium nitride of 50 atm % or more. This titanium nitride serves as the second electrode of the rectifying element in the 4-terminal switch.

(Step 6)

A 1st hard mask film 212 and a 2nd hard mask film 213 are stacked in this order on the 3rd electrode 211. The 1st hard mask film 212 and the 2nd hard mask film 213 can be formed by a plasma CVD method. The 1st hard mask film 212 and the 2nd hard mask film 213 are preferably different kinds of film, and, for example, the 1st hard mask film 212 can be a silicon nitride film or a silicon carbonitride film, and the 2nd hard mask film 213 can be a silicon oxide film. At this time, the 1st hard mask film 212 is preferably the same material as a protective insulating film 214 and a barrier insulating film 207 described below. The 1st hard mask film 212 can be formed by a plasma CVD method, and, for example, a highly dense silicon nitride film or the like formed from a high density plasma of a mixed gas of SiH$_4$/N$_2$ is preferably used. For example, a silicon nitride film having a thickness of 30 nm and a silicon oxide film having a thickness of 100 nm are formed.

(Step 7)

A photoresist 232 for patterning the rectifying element section of the 4-terminal switch is formed on the 2nd hard mask film 213 by a lithography method.

(Step 8)

With the photoresist 232 being a mask, the 2nd hard mask film 213 is partially dry-etched, and then the photoresist 232 is removed using oxygen plasma ashing and an organic stripping solution. The thickness of a portion where the photoresist 232 is not formed is reduced by etching, and the thickness of a portion where the photoresist 232 is formed is not reduced. The etching thickness is desirably about 30 nm to 70 nm. Specifically, assuming that the etching thickness is 60 nm, the remaining film of the 2nd hard mask film 213 at a portion where the photoresist 232 is formed is 100 nm, and the remaining film of the 2nd hard mask film 213 at a portion where the photoresist 225 is not formed is about 40 nm.

(Step 9)

A photoresist 233 for patterning a 4-terminal switch element section is formed on the processed 2nd hard mask film 213 by a lithography method.

(Step 10)

With the photoresist 233 being a mask, the remainder of the 2nd hard mask film 213 is dry-etched, and then the photoresist 233 is removed using oxygen plasma ashing and an organic stripping solution. A portion where neither the photoresist 232 nor the photoresist 233 was formed exposes the 1st hard mask film 212 after dry etching. The 2nd hard mask film 213 is processed by two-step dry etching, and the remaining film at a portion corresponding to the rectifying element section of the 4-terminal switch is 100 nm, the remaining film other than a portion where the rectifying element of the 4-terminal switch with a rectifying function is 40 nm, and the remaining film at other portions is 0 nm. The 1st hard mask film 212 is desirably not dry-etched at a portion where the 1st hard mask film 212 exposes, but it may be etched about several nm.

(Step 11)

With the 2nd hard mask film 213 being a mask and in a manner of transferring the shape of the processed 2nd hard mask film 213 to lower layers, the 1st hard mask film 212, the 3rd electrode 211, the rectifying element stack 208, the 2nd electrode 210, and the ion conductive layer 209 are successively dry-etched. As a result, a four-terminal switch 222 is formed. At a portion where the 4-terminal switch is formed, the 2nd hard mask film 213, the 1st hard mask film 212, and the 3rd electrode 211 remain only at a portion where the rectifying element is formed. The 3rd electrode 211 is divided into two at the center to become a 3rd electrode A 211a and a 3rd electrode B 211b (simply referred to as the 3rd electrode 211 also in the following description). The 2nd hard mask film 213 may be removed. At a portion where the rectifying element is not formed within a portion where the 4-terminal switch is formed, the 2nd hard mask film 213, the 1st hard mask film 212, and the 3rd electrode 211 are removed by etching. Portions where the photoresist 232 and the photoresist 233 were not formed in step 7 and step 9 are removed by etching to the 2nd electrode 210 and the ion conductive layer 209. After dry etching, the barrier insulating film 207 may be etched only about several nm.

For example, when the 3rd electrode 211 and the upper layer of the 2nd electrode 210 are titanium nitride, processing can be performed with Cl$_2$-based reactive ion etching (RIE), and when the lower layer of the 2nd electrode 210 is an alloy of ruthenium and titanium, RIE processing can be performed with a mixed gas of Cl$_2$/O$_2$. The rectifying element stack 208 can be processed with the same Cl$_2$-based RIE as the 3rd electrode 211 and the 2nd electrode 210, together with the 3rd electrode 211 and the 2nd electrode 210. In the etching of the ion conductive layer 209, dry etching needs to be stopped on the barrier insulating film 207 at the lower surface. When the ion conductive layer 209 is a SIOCH-based polymer film containing silicon, oxygen, carbon, and hydrogen, and the barrier insulating film 207 is a silicon nitride film or a silicon carbonitride film, RIE processing can be performed by adjusting etching conditions with a mixed gas such as a CF$_4$-based, CF$_4$/Cl$_2$-based, CF$_4$/Cl$_2$/Ar-based. The use of such a hard mask RIE method enables a variable resistance element section to be processed without exposing the variable resistance element section to oxygen plasma ashing for resist removal. Also, performing oxidation treatment by an oxygen plasma after processing enables exposure to oxidation plasma treatment without being dependent on the resist removing time.

(Step 12)

A protective insulating film 214 (e.g., a silicon nitride film or a silicon carbonitride film, 20 nm) is deposited on the 1st hard mask film 212, the 2nd hard mask film 213, the 3rd electrode 211, the rectifying element stack 208, the 2nd electrode 210, and the barrier insulating film 207 including the ion conductive layer 209. Although the protective insulating film 214 can be formed by a plasma CVD method, the protective insulating film needs to be maintained under reduced pressure in a reaction chamber before film formation, and, at this time, oxygen may be desorbed from the side surface of the ion conductive layer 209, and the leakage current of the ion conductive layer may increase. In order to suppress oxygen desorption, the temperature of forming the protective insulating film 214 is preferably at 400° C. or lower. Moreover, due to exposure to a film forming gas under reduced pressure before film formation, a reducing gas is preferably not used. For example, for the protective insulating film 214, a silicon nitride film formed by a high density plasma of a mixed gas of $SiH_4/N_2$ at a substrate temperature of 400° C. is preferably used.

(Step 13)

An interlayer insulating film 215 (e.g., a silicon oxide film), a low dielectric constant film having a low specific dielectric constant as a low-k film 216 (e.g., a SiOCH film, a film thickness of 150 nm), and an interlayer insulating film 217 (e.g., a silicon oxide film) are deposited in this order on the protective insulating film 214, then wiring grooves for a 2nd wiring A 218a and a 2nd wiring B 218b and pilot holes for a via A 219a and a via B 219b are formed, the 2nd wiring A 218a and the 2nd wiring B 218b (e.g., copper) as well as the via A 219a and the via B 219b (e.g., copper) are simultaneously formed in the wiring grooves and the pilot holes via a 2nd barrier metal A 220a and a 2nd barrier metal B 220b (e.g., tantalum nitride/tantalum) respectively using a dual damascene wiring process, and then a barrier insulating film 221 (e.g., a silicon nitride film) is deposited on the interlayer insulating film 217 including the 2nd wiring A 218a and the 2nd wiring B 218b. For the formation of the 2nd wiring A 218a, the 2nd wiring B 218b, the via A 219a, and the via B 219b, the same process as the first-wiring formation can be used. The interlayer insulating film 215, the low-k film 216, and the interlayer insulating film 217 can be formed by a plasma CVD method. In order to eliminate the height-differences formed by the 4-terminal switch 222, the interlayer insulating film 215 may be deposited thickly and ground by CMP to planarize the interlayer insulating film 215 so that the interlayer insulating film 215 has a desired thickness. The wiring grooves for the 2nd wiring A 218a and the 2nd wiring B 218b as well as the pilot holes for the via A 219a and the via B 219b are patterned by exposure with the same photomask, simultaneously etched, and formed. The 1st hard mask film 212 and the 2nd hard mask film 213 are etched and removed during the formation of the pilot holes for the via A 219a and the via B 219b. As a result, the via A 219a and the via B 219b are directly connected to the 3rd electrode 211(the via A 219a is connected to the 3rd electrode A 211a, and the via B 219b is connected to the 3rd electrode B 211b). Etching of the wiring grooves and the pilot holes stops at the 3rd electrode 211 by using a fluorocarbon-based etching gas having a low etching rate with respect to titanium nitride.

In addition, by forming a wiring layer for a further higher layer and forming a terminal or the like as necessary, a semiconductor device including the 4-terminal switch of the present embodiment can be obtained.

Third Example Embodiment

Figure 11A:
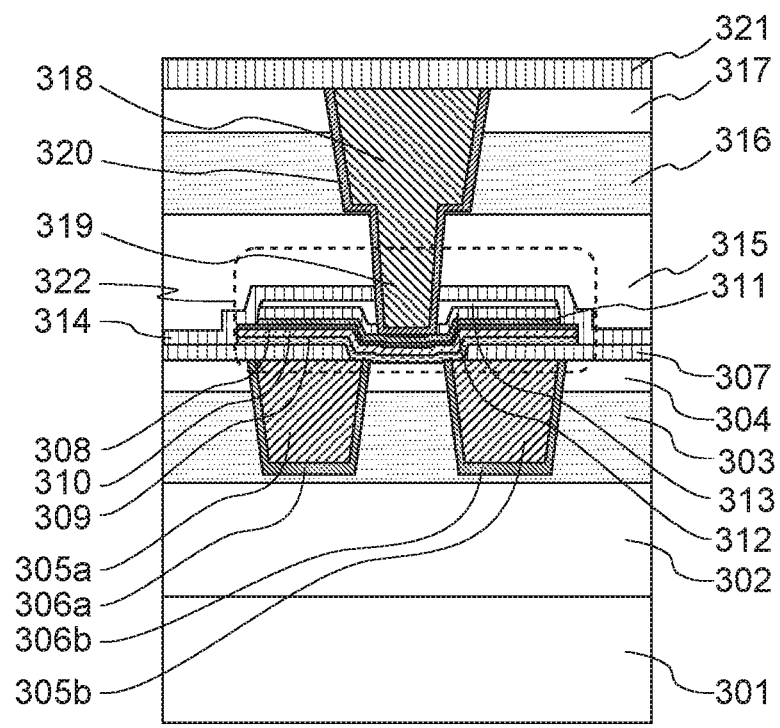
FIG. 11A is a cross-sectional schematic diagram showing one configurational example of a 3-terminal switch with a rectifying function in a multilayer wiring of a third example embodiment.
Figure 11B:
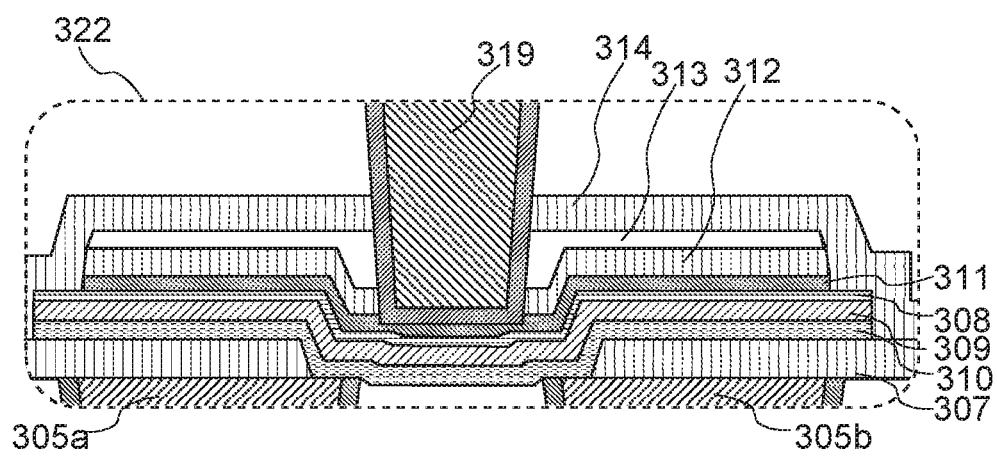
FIG. 11B is an enlarged cross-sectional diagram of a switching element in FIG. 11A.

The configuration of the "3-terminal switch with a rectifying function formed inside a multilevel interconnect" of the third example embodiment will now be described. FIG. 11 is a cross-sectional view schematically showing one configurational example of a switching element employing the configuration of the "3-terminal switch with a rectifying function formed inside a multilevel interconnect" of the third example embodiment. It is a device having a 3-terminal switch with a rectifying function (hereinafter referred to as a "3-terminal switch") 322 inside a multilevel interconnect on a semiconductor substrate 301. The difference from the second example embodiment is that one terminal from a 2nd wiring 318 is connected to the 3-terminal switch 322. In order to achieve this configuration, the 3rd electrode 311 is not electrically divided.

The multilevel interconnect has an insulating laminate obtained by stacking an interlayer insulating film 302, a low-k film 303, an interlayer insulating film 304, a barrier insulating film 307, a protective insulating film 314, an interlayer insulating film 315, a low-k film 316, an interlayer insulating film 317, and a barrier insulating film 321 in this order on the semiconductor substrate 301. In the multilevel interconnect, a 1st wiring A 305a and a 1st wiring B 305b are buried in wiring grooves formed in the interlayer insulating film 304 and the low-k film 303 via a 1st barrier metal A 306a and a 1st barrier metal B 306b. In the multilevel interconnect, a 2nd wiring 318 is buried in wiring groove formed in the interlayer insulating film 317 and the low-k film 316. A via 319 is buried in a pilot hole formed in the interlayer insulating film 315, the protective insulating film 314, and the hard mask film 312, the 2nd wiring 318 and the via 319 are integrated, and the side surfaces and the bottom surfaces of the 2nd wiring 318 and the via 319 are covered with a 2nd barrier metal 320.

The material and function of each component are the same as the second example embodiment, and the description is omitted.

Figure 14:
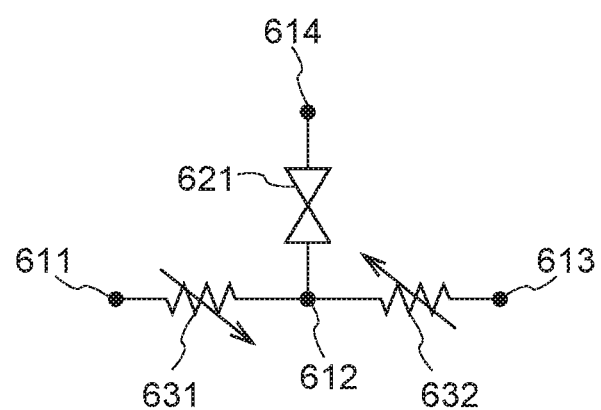
FIG. 14 is a circuit diagram of the 3-terminal switch with a rectifying function shown in the third example embodiment.

FIG. 14 is a circuit diagram illustrating one configurational example of a switching element equipped with the rectifying element of the present example embodiment (a 3-terminal switch). As shown in FIG. 14, this switching element has a rectifying element 621 corresponding to the rectifying element shown in FIG. 1 and two variable resistance elements 631, 632. Moreover, this switching element corresponds to the 3-terminal switch 322 shown in FIG. 11. In FIGS. 14, 611 to 614 each denotes a terminal, and three terminals 611, 613, and 614 are connected to the respective wirings of the multilevel interconnect and thereby constitute the 3-terminal switch. The two variable resistance elements 631, 632 are each connected to two terminals. That is to say, the variable resistance element 631 is connected to the terminals 611 and 612, and the variable resistance element 632 is connected to the terminals 612 and 613. The active electrode of the variable resistance element 631 is the terminal 611, and the active electrode of the variable resistance element 632 is the terminal 613. In FIG. 11, the terminal 611 is the 1st wiring A 305a, and the terminal 613 is the 1st wiring B 305b. The terminal 612 serves as the inactive electrode of the variable resistance element 631 as well as the inactive electrode of the variable resistance element 632. In FIG. 11, the 2nd electrode 310 is the terminal 612. Among the first electrode and the second electrode of the rectifying elements 621, one electrode is connected to the terminal 612, and the other electrode is connected to the terminal 614. The 3rd electrode 111 in FIG. 11 is the terminal 614.

Thus, in the present example embodiment, current control of two resistance change elements is performed by one rectifying element, and the effect is as described in the first embodiment.

Embodiment 3

Figure 12:
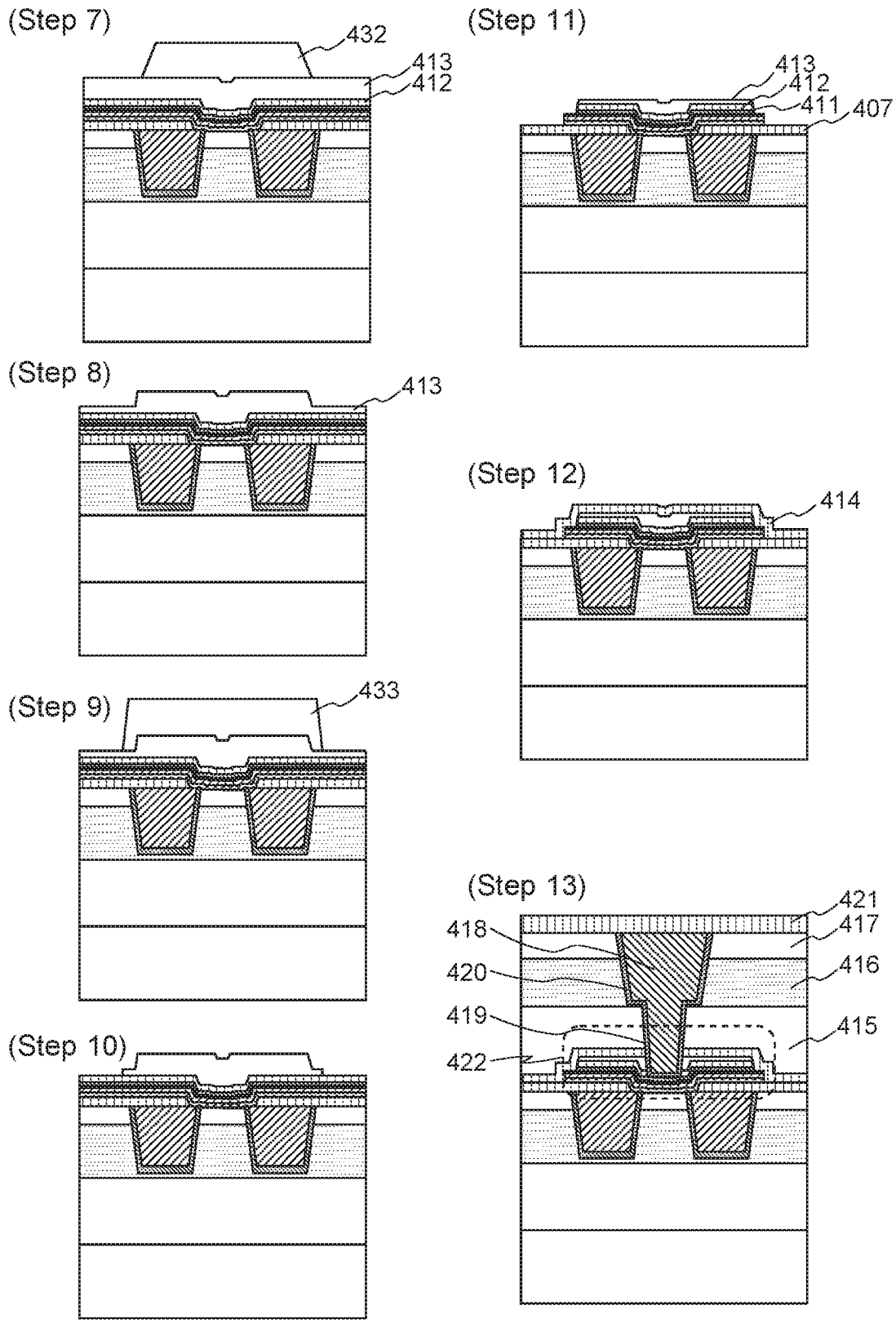
FIG. 12 is a cross-sectional schematic diagram showing the steps of manufacturing the 3-terminal switch with a rectifying function in the multilayer wiring of the Embodiment 3 in the third example embodiment.

The manufacturing process of a semiconductor device in which the "3-terminal switch with a rectifying function formed inside a multilevel interconnect" described in the above third example embodiment was formed, and, in particular, the steps of forming a switching element employing the configuration of the "3-terminal switch with a rectifying function" inside a multilevel interconnect will now be described in reference to FIG. 12. The steps up to step 6 of the Embodiment 2 shown in FIG. 10 are carried out in the same manner, and therefore the description is omitted.
(Step 7)

A photoresist 432 for patterning the rectifying element section of the 3-terminal switch is formed on a 2nd hard mask film 413 by a lithography method. The photoresist 432 does not need to electrically separate the 3rd electrode 411 and is therefore formed over the entire rectifying element section.
(Step 8)

With the photoresist 432 being a mask, the 2nd hard mask film 413 is partially dry-etched, and then the photoresist 432 is removed using oxygen plasma ashing and an organic stripping solution. The thickness of a portion where the photoresist 432 is not formed is reduced by etching, and the thickness of a portion where the photoresist 432 is formed is not reduced. The etching thickness is desirably about 30 nm to 70 nm. Specifically, assuming that the etching thickness is 60 nm, the remaining film of the 2nd hard mask film 413 at a portion where the photoresist 423 is formed is 100 nm, and the remaining film of the 2nd hard mask film 413 at a portion where the photoresist 425 is not formed is about 40 nm.
(Step 9)

A photoresist 433 for patterning a 3-terminal switch element section is formed on the processed 2nd hard mask film 413 by a lithography method.
(Step 10)

With the photoresist 433 being a mask, the remainder of the 2nd hard mask film 413 is dry-etched, and then the photoresist 433 is removed using oxygen plasma ashing and an organic stripping solution. A portion where neither the photoresist 432 nor the photoresist 433 was formed exposes the 1st hard mask film 412 after dry etching. The 2nd hard mask film 413 is processed by two-step dry etching, and the remaining film at a portion corresponding to the rectifying element section of the 3-terminal switch is 100 nm, the remaining film other than a portion where the rectifying element of the 4-terminal switch with a rectifying function is formed is 40 nm, and the remaining film at other portions is 0 nm. The 1st hard mask film 412 is desirably not dry-etched at a portion where the 1st hard mask film 412 exposes, but it may be etched about several nm.
(Step 11)

With the 2nd hard mask film 413 being a mask and in a manner of transferring the shape of the processed 2nd hard mask film 413 to lower layers, the 1st hard mask film 412, the 3rd electrode 411, the rectifying element stack 408, the 2nd electrode 410, and the ion conductive layer 409 are successively dry-etched to thereby form the 3-terminal switch 322. At a portion where the 3-terminal switch is formed, the 2nd hard mask film 413, the 1st hard mask film 412, and the 3rd electrode 411 remain only at a portion where the rectifying element is formed. The 2nd hard mask film 413 may be removed. At a portion where the rectifying element is not formed within a portion where the 3-terminal switch is formed, the 2nd hard mask film 413, the 1st hard mask film 412, and the 3rd electrode 411 are removed by etching. Portions where the photoresist 432 and the photoresist 433 were not formed in step 7 and step 9 are removed by etching to the 2nd electrode 410 and the ion conductive layer 409. After dry etching, the barrier insulating film 407 may be etched only about several nm.

For example, when the 3rd electrode 411 and the upper layer of the 2nd electrode 410 are titanium nitride, processing can be performed with $Cl_2$-based RIE, and when the lower layer of the 2nd electrode 410 is an alloy of ruthenium and titanium, RIE processing can be performed with a mixed gas of $Cl_2/O_2$. The rectifying element stack 408 can be processed with the same $Cl_2$-based RIE as the 3rd electrode 411 and the 2nd electrode 410, together with the 3rd electrode 411 and the 2nd electrode 410. In the etching of the ion conductive layer 409, dry etching needs to be stopped on the barrier insulating film 407 at the lower surface. When the ion conductive layer 409 is a SIOCH-based polymer film containing silicon, oxygen, carbon, and hydrogen, and the barrier insulating film 407 is a silicon nitride film or a silicon carbonitride film, RIE processing can be performed by regulating etching conditions with a mixed gas such as a $CF_4$-based, $CF_4/Cl_2$-based, $CF_4/Cl_2/Ar$-based. The use of such a hard mask RIE method enables a variable resistance element section to be processed without exposing the variable resistance element section to oxygen plasma ashing for resist removal. Also, performing oxidation treatment by an oxygen plasma after processing enables exposure to oxidation plasma treatment without being dependent on the resist removing time.
(Step 12)

A protective insulating film 414 (e.g., a silicon nitride film or a silicon carbonitride film, 20 nm) is deposited on the 1st hard mask film 412, the 2nd hard mask film 413, the 3rd electrode 211, the rectifying element stack 408, the 2nd electrode 410, and the barrier insulating film 407 including the ion conductive layer 409. Although the protective insulating film 414 can be formed by a plasma CVD method, the protective insulating film needs to be maintained under reduced pressure in a reaction chamber before film formation, and, at this time, oxygen may be desorbed from the side surface of the ion conductive layer 409, and the leakage current of the ion conductive layer may increase. In order to suppress oxygen desorption, the temperature of forming the protective insulating film 414 is preferably at 400° C. or lower. Moreover, due to exposure to a film forming gas under reduced pressure before film formation, a reducing gas is preferably not used. For example, a silicon nitride film formed by a high density plasma of a mixed gas of $SiH_4/N_2$ at a substrate temperature of 400° C. is preferably used.
(Step 13)

An interlayer insulating film 415 (e.g., a silicon oxide film), a low dielectric constant film having a low specific dielectric constant as a low-k film 416 (e.g., a SiOCH film, a film thickness of 150 nm), and an interlayer insulating film 417 (e.g., a silicon oxide film) are deposited in this order on the protective insulating film 414, then a wiring groove for a 2nd wiring 418 and a pilot hole for a via 419 are formed, the 2nd wiring 418 (e.g., copper) and the via 419 (e.g., copper) are simultaneously formed in the wiring groove and the pilot hole via a 2nd barrier metal 420 (e.g., tantalum nitride/tantalum) respectively using a dual damascene wiring process. Then a barrier insulating film 421 (e.g., a silicon nitride film) is deposited on the interlayer insulating film 417 including the via 419. For the formation of the 2nd wiring 418 and the via 419, the same process as the first-wiring formation can be used. The interlayer insulating film 415, the low-k film 416, and the interlayer insulating film 417 can be formed by a plasma CVD method. In order to eliminate the height differences formed by the 3-terminal switch 422, the interlayer insulating film 415 may be deposited thickly and ground by CMP to planarize the interlayer insulating film 415 so that the interlayer insulating film 415 has a desired thickness. The wiring groove for the 2nd wiring 418 and the pilot hole for the via 419 are patterned by exposure with the same photomask, simultaneously etched, and formed. The 1st hard mask film 412 and the 2nd hard mask film 413 are etched and removed during the formation of the pilot hole for the via 419. As a result, the via 419 is directly connected to the 3rd electrode 411. Etching of the wiring groove and the pilot hole stops at the 3rd electrode 411 by using a fluorocarbon-based etching gas having a slow etching rate with respect to titanium nitride.

(Supplementary Note)

The present invention includes the following aspects.

[Item 1]

A rectifying element having a structure in which a first electrode, a first buffer layer, a rectifying layer, a second buffer layer, and a second electrode are stacked in this order, wherein the rectifying layer comprises a first silicon nitride layer having a high nitrogen content and second silicon nitride layers having a lower nitrogen content than the first silicon nitride layer, and the second silicon nitride layers are in contact with the first buffer layer and the second buffer layer, respectively, and the first silicon nitride layer is sandwiched between the second silicon nitride layers.

[Item 2]

The rectifying element according to item 1, wherein the nitrogen content of the first silicon nitride layer is 50 atm % or more, and the nitrogen content of the second silicon nitride layers is 50 atm % or less.

[Item 3]

The rectifying element according to item 1 or 2, wherein the first buffer layer and the second buffer layer comprise hydrogenated amorphous silicon.

[Item 4]

The rectifying element according to any one of items 1 to 3, wherein the first electrode and the second electrode comprise nitride of titanium or tantalum, and the nitride has a nitrogen content of 50 atm % or less.

[Item 5]

A switching element, which is provided in a signal path of a logic circuit and comprises at least one rectifying element and two variable resistance elements, wherein the rectifying element is the rectifying element according to any one of items 1 to 4.

[Item 6]

The switching element according to item 5, comprising two of the rectifying elements and the two variable resistance elements, wherein each of the two variable resistance elements is electrically connected to two terminals, one of the two terminals in the two variable resistance elements is connected to each other, and the remained terminals of the two terminals in the two variable resistance elements are an input terminal and an output terminal for the signal, respectively, and among a first electrode or a second electrode of respective two rectifying elements, one electrode is connected to the terminal connected to each other in the two variable resistance elements, and the other electrode is connected to a control terminal.

[Item 7]

The switching element according to item 6, which is a 4-terminal switch formed inside a multilevel interconnect, and comprises:

two 1st electrodes partially exposing two 1st wirings, respectively, formed in a lower layer of the 4-terminal switch, a variable resistance layer extending between the two lower electrodes, a 2nd electrode on the variable resistance layer, a rectifying element stack on the 2nd electrode, comprising the first buffer layer, the rectifying layer, and the second buffer layer of the rectifying element, two mutually independent 3rd electrodes on the rectifying element stack, and two 2nd wirings formed in an upper layer of the 4-terminal switch and connected to the two 3rd electrodes, respectively.

[Item 8]

The switching element according to item 5, comprising the one rectifying element and the two variable resistance elements, wherein each of the two variable resistance elements is electrically connected to two terminals, one of the two terminals in the two variable resistance elements is shared by the two variable resistance elements, and the remained terminals of the two terminals in the two variable resistance elements are an input terminal and an output terminal for the signal, respectively, and among a first electrode and a second electrode of the rectifying element, one electrode is connected to the terminal shared by the two variable resistance elements, and the other electrode is connected to a control terminal.

[Item 9]

The switching element according to item 8, which is a 3-terminal switch formed inside a multilevel interconnect, and comprises:

two 1st electrodes partially exposing two 1st wirings, respectively, formed in a lower layer of the 3-terminal switch, a variable resistance layer extending between the two lower electrodes, a 2nd electrode on the variable resistance layer, a rectifying element stack on the 2nd electrode, comprising the first buffer layer, the rectifying layer, and the second buffer layer of the rectifying element, a 3rd electrode on the rectifying element stack, and a 2nd wiring formed in an upper layer of the 3-terminal switch and connected to the 3rd electrode.

[Item 10]

The switching element according to any one of items 5 to 9, wherein the variable resistance element comprises an ion conductive layer for conducting metal ions according to an electric field, and the ion conductive layer comprises a polymeric film comprising at least silicon, oxygen, carbon, and hydrogen.

[Item 11]

The switching element according to item 10, wherein the 2nd electrode on the variable resistance layer comprises a ruthenium alloy layer to be an upper electrode of the variable resistance element and a metal nitride layer to be a lower electrode of the rectifying element.

[Item 12]

A method for manufacturing the rectifying element according to any one of items 1 to 4, the method comprising the step of forming the rectifying layer by a plasma CVD method, wherein a flow rate of silane gas introduced into a chamber during formation of the first silicon nitride layer is 5% or less of a flow rate of nitrogen gas, and a flow rate of silane gas introduced into a chamber during formation of the second silicon nitride layers is 30% or more of a flow rate of nitrogen gas.

[Item 13]

The method according to item 12, wherein the first buffer layer and the second buffer layer are amorphous silicon formed by a plasma CVD method, and the first buffer layer, the rectifying layer, and the second buffer layer are successively formed without exposure to air.

The present invention has been described above in reference to example embodiments and working examples, but the present invention is not limited to the above example embodiments and working examples. Various modifications can be made to the configurations and details of the present invention within the scope of the present invention as can be understood by those skilled in the art.

The present application claims priority to Japanese Patent Application No. 2016-153930 filed on Aug. 4, 2016, the entire disclosure of which is incorporated herein by reference.

INDUSTRIAL APPLICABILITY

The variable resistance element according to the present invention can be utilized as a nonvolatile switching element, and, in particular, the present invention can be suitably utilized as a nonvolatile switching element constituting electronic devices such as programmable logic and memory.

REFERENCE SIGNS LIST

11 First electrode
12 Second electrode
13 Rectifying layer
14 First buffer layer
15 Second buffer layer
16 First silicon nitride layer
17 Second silicon nitride layer
101, 201, 301 Semiconductor substrate
102, 104, 115, 117, 202, 204, 215, 217, 302, 304, 315, 317, 415, 417 Interlayer dielectric film
103, 116, 203, 216, 303, 316, 416 Low-k film
107, 121, 207, 221, 307, 321, 421 Barrier insulating film
108, 208, 308 Rectifying element stack
109, 209, 309 Ion conductive layer
110, 210, 310 2nd electrode
111, 211, 311 3rd electrode
105a, 205a, 305a 1st wiring A
105b, 205b, 305b 1st wiring B
106a, 206a, 306a 1st barrier metal A
106b, 206b, 306b 1st barrier metal B
118a, 218a 2nd wiring A
118b, 218b 2nd wiring B
318, 418 2nd wiring
120a, 220a 2nd barrier metal A
120b, 220b 2nd barrier metal B
320, 420 2nd barrier metal
112, 212, 312, 412 1st hard mask film
113, 213, 313, 413 Second hard mask film
114, 214, 314, 414 Protective insulating film
119a, 219a Via A
119b, 219b Via B
319, 419 Via
122, 222 4-Terminal switch with a rectifying function
322, 422 3-Terminal switch with a rectifying function
511-516, 611-614 Terminal
521, 522, 621 Rectifying element
531, 532, 631, 632 Variable resistance element

What is claimed is:

1. A rectifying element having a structure in which a first electrode, a first buffer layer, a rectifying layer, a second buffer layer, and a second electrode are stacked in this order, wherein the rectifying layer comprises:

a first silicon nitride layer having a high nitrogen content and, two second silicon nitride layers each having a lower nitrogen content than the first silicon nitride layer and being disposed in contact with two opposing surfaces of the first silicon nitride layer, respectively, and one of the second silicon nitride layers is in contact with the first buffer layer and the other of the second silicon nitride layers is in contact with the second buffer layer.

2. The rectifying element according to claim 1, wherein the nitrogen content of the first silicon nitride layer is 50 atm % or more, and the nitrogen content of each of the second silicon nitride layers is 50 atm % or less.

3. The rectifying element according to claim 1, wherein the first buffer layer and the second buffer layer comprise hydrogenated amorphous silicon.

4. The rectifying element according to claim 1, wherein the first electrode and the second electrode comprise nitride of titanium or tantalum, and the nitride has a nitrogen content of 50 atm % or less.

5. A switching element, which is provided in a signal path of a logic circuit and comprises at least one rectifying element and two variable resistance elements, wherein the rectifying element is the rectifying element according to claim 1.

6. The switching element according to claim 5, comprising two of the rectifying elements and the two variable resistance elements, wherein each of the two variable resistance elements is electrically connected to two terminals, one of the two terminals in the two variable resistance elements is connected to each other, and the remained terminals of the two terminals in the two variable resistance elements are an input terminal and an output terminal for the signal, respectively, and among a first electrode or a second electrode of respective two rectifying elements, one electrode is connected to the terminal connected to each other in the two variable resistance elements, and the other electrode is connected to a control terminal.

7. The switching element according to claim 5, which is a 4-terminal switch formed inside a multilevel interconnect, and comprises:

two 1st electrodes partially exposing two 1st wirings, respectively, formed in a lower layer of the 4-terminal switch, a variable resistance layer extending between the two 1st electrodes,
a 2nd electrode on the variable resistance layer,
a rectifying element stack on the 2nd electrode, comprising the first buffer layer, the rectifying layer, and the second buffer layer of the rectifying element,
two mutually independent 3rd electrodes provided on the rectifying element stack, and
two 2nd wirings formed in an upper layer of the 4-terminal switch and connected to the two 3rd electrodes, respectively.

8. The switching element according to claim 5, comprising the one rectifying element and the two variable resistance elements, wherein
each of the two variable resistance elements is electrically connected to two terminals,
one of the two terminals in the two variable resistance elements is shared by the two variable resistance elements, and the remained terminals of the two terminals in the two variable resistance elements are an input terminal and an output terminal for the signal, respectively, and
among a first electrode and a second electrode of the rectifying element, one electrode is connected to the terminal shared by the two variable resistance elements, and the other electrode is connected to a control terminal.

9. The switching element according to claim 5, which is a 3-terminal switch formed inside a multilevel interconnect, and comprises:
two 1st electrodes partially exposing two 1st wirings, respectively, formed in a lower layer of the 3-terminal switch,
a variable resistance layer extending between the two 1st electrodes,
a 2nd electrode on the variable resistance layer,
a rectifying element stack on the 2nd electrode, comprising the first buffer layer, the rectifying layer, and the second buffer layer of the rectifying element,
a 3rd electrode provided on the rectifying element stack, and
a 2nd wiring formed in an upper layer of the 3-terminal switch and connected to the 3rd electrode.

10. The switching element according claim 5, wherein the variable resistance element comprises an ion conductive layer for conducting metal ions according to an electric field, and the ion conductive layer comprises a polymeric film comprising at least silicon, oxygen, carbon, and hydrogen.

11. The switching element according to claim 10, wherein the 2nd electrode on the variable resistance layer comprises a ruthenium alloy layer to be an upper electrode of the variable resistance element and a metal nitride layer to be a lower electrode of the rectifying element.

12. A method for manufacturing the rectifying element according to claim 1,
the method comprising the step of forming the rectifying layer by a plasma CVD method, wherein
a flow rate of silane gas introduced into a chamber during formation of the first silicon nitride layer is 5% or less of a flow rate of nitrogen gas, and
a flow rate of silane gas introduced into a chamber during formation of the second silicon nitride layers is 30% or more of a flow rate of nitrogen gas.

13. The method according to claim 12, wherein the first buffer layer and the second buffer layer are amorphous silicon formed by a plasma CVD method, and the first buffer layer, the rectifying layer, and the second buffer layer are successively formed without exposure to air.

14. A switching element, which is provided in a signal path of a logic circuit and comprises at least one rectifying element and two variable resistance elements, wherein
the rectifying element is the rectifying element according to claim 2.

15. A switching element, which is provided in a signal path of a logic circuit and comprises at least one rectifying element and two variable resistance elements, wherein
the rectifying element is the rectifying element according to claim 3.

16. A switching element, which is provided in a signal path of a logic circuit and comprises at least one rectifying element and two variable resistance elements, wherein
the rectifying element is the rectifying element according to claim 4.

* * * * *